(12) United States Patent
Nakabayashi et al.

(10) Patent No.: US 10,608,154 B2
(45) Date of Patent: Mar. 31, 2020

(54) LIGHT EMITTING DEVICE

(71) Applicant: NICHIA CORPORATION, Anan-shi, Tokushima (JP)

(72) Inventors: Takuya Nakabayashi, Tokushima (JP); Gensui Tamura, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 16/229,666

(22) Filed: Dec. 21, 2018

(65) Prior Publication Data

US 2019/0198738 A1 Jun. 27, 2019

(30) Foreign Application Priority Data

Dec. 22, 2017 (JP) ................ 2017-246556
Jan. 17, 2018 (JP) ................ 2018-005345

(Continued)

(51) Int. Cl.
*H01L 33/00* (2010.01)
*H01L 33/64* (2010.01)
(Continued)

(52) U.S. Cl.
CPC ......... *H01L 33/642* (2013.01); *H01L 33/486* (2013.01); *H01L 33/60* (2013.01); *H01L 33/62* (2013.01); *H01L 33/647* (2013.01)

(58) Field of Classification Search
CPC . H01L 25/0753; H01L 33/483; H01L 33/486; H01L 33/502; H01L 33/56;
(Continued)

(56) References Cited

U.S. PATENT DOCUMENTS

2010/0207133 A1  8/2010  Taguchi
2011/0051039 A1  3/2011  Okamoto et al.
(Continued)

FOREIGN PATENT DOCUMENTS

| JP | 2001185751 A | 7/2001 |
| JP | 2004-207542 A | 7/2004 |
| JP | 2004-281994 A | 10/2004 |
| JP | 2008277782 A | 11/2008 |
| JP | 2009-021417 A | 1/2009 |

(Continued)

*Primary Examiner* — Brook Kebede
(74) *Attorney, Agent, or Firm* — Hunton Andrews Kurth LLP

(57) ABSTRACT

A light emitting device includes a substrate including a base member including a front surface, a rear surface opposite to the front surface, a bottom surface perpendicular to the front surface, and a top surface opposite to the bottom surface, a first wiring portion located on the front surface, and a second wiring portion located on the rear surface; a light emitting element electrically connected with the first wiring portion; and a first reflective member covering a lateral surface of the light emitting element and the front surface of the base member. The base member has a recessed portion opened on the rear surface and the bottom surface. The substrate includes a third wiring portion covering an inner wall of the recessed portion and electrically connected with the second wiring portion, and a via in contact with the first wiring portion, the second wiring portion and the third wiring portion.

20 Claims, 22 Drawing Sheets

(30) Foreign Application Priority Data

Jun. 18, 2018 (JP) .................................. 2018-115073
Jul. 26, 2018 (JP) .................................. 2018-139908

(51) Int. Cl.
*H01L 33/48* (2010.01)
*H01L 33/62* (2010.01)
*H01L 33/60* (2010.01)

(58) Field of Classification Search
CPC ......... H01L 33/54; H01L 33/60; H01L 33/62; H01L 33/647; H01L 33/642
USPC .................................................. 257/95–100
See application file for complete search history.

(56) References Cited

U.S. PATENT DOCUMENTS

| | | | |
|---|---|---|---|
| 2012/0205677 A1 | 8/2012 | Kobayakawa et al. | |
| 2013/0020595 A1 | 1/2013 | Moriguchi et al. | |
| 2015/0340578 A1 | 11/2015 | Tamaki et al. | |
| 2017/0179354 A1* | 6/2017 | Hayashi | H01L 33/20 |
| 2017/0294419 A1* | 10/2017 | Nakabayashi | H01L 25/0753 |
| 2017/0309793 A1* | 10/2017 | Seo | H01L 33/38 |

FOREIGN PATENT DOCUMENTS

| | | |
|---|---|---|
| JP | 2012-124191 A | 6/2012 |
| JP | 2012169326 A | 9/2012 |
| JP | 2013-026510 A | 2/2013 |
| JP | 2015-220426 A | 12/2015 |
| JP | 2017-188589 A | 10/2017 |

* cited by examiner

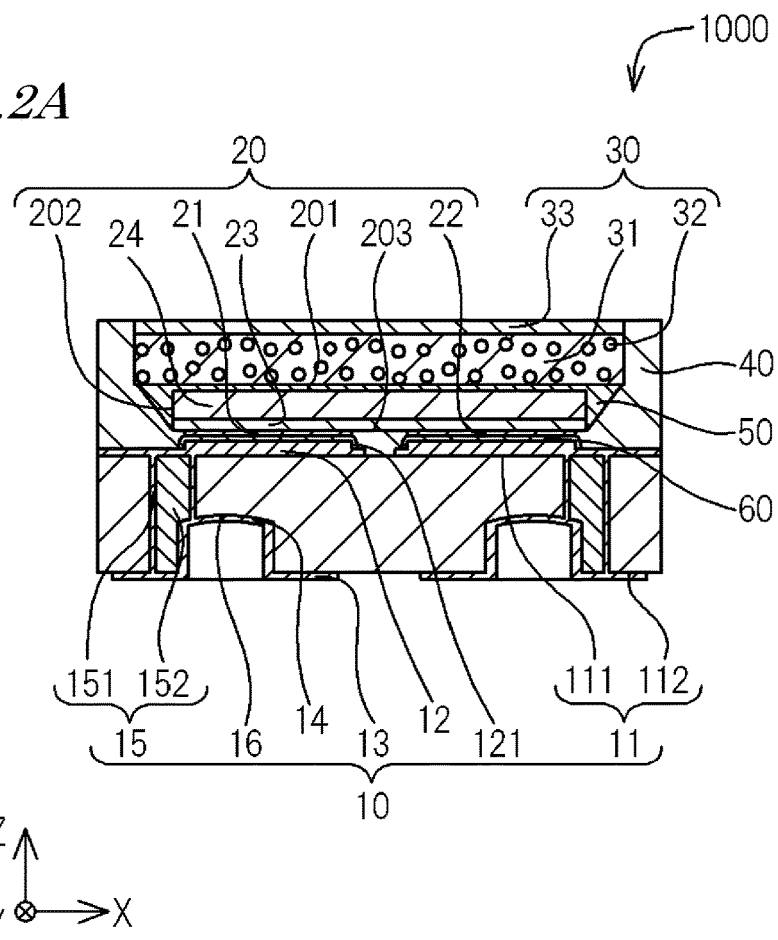
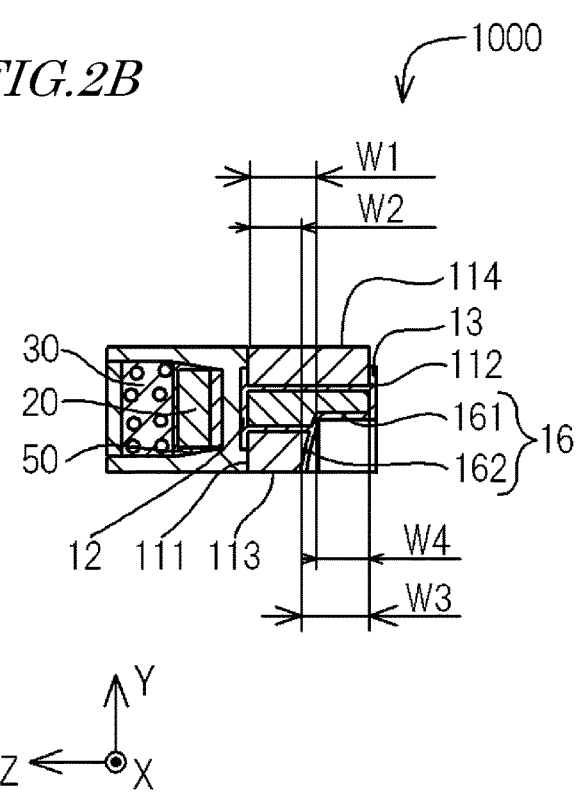

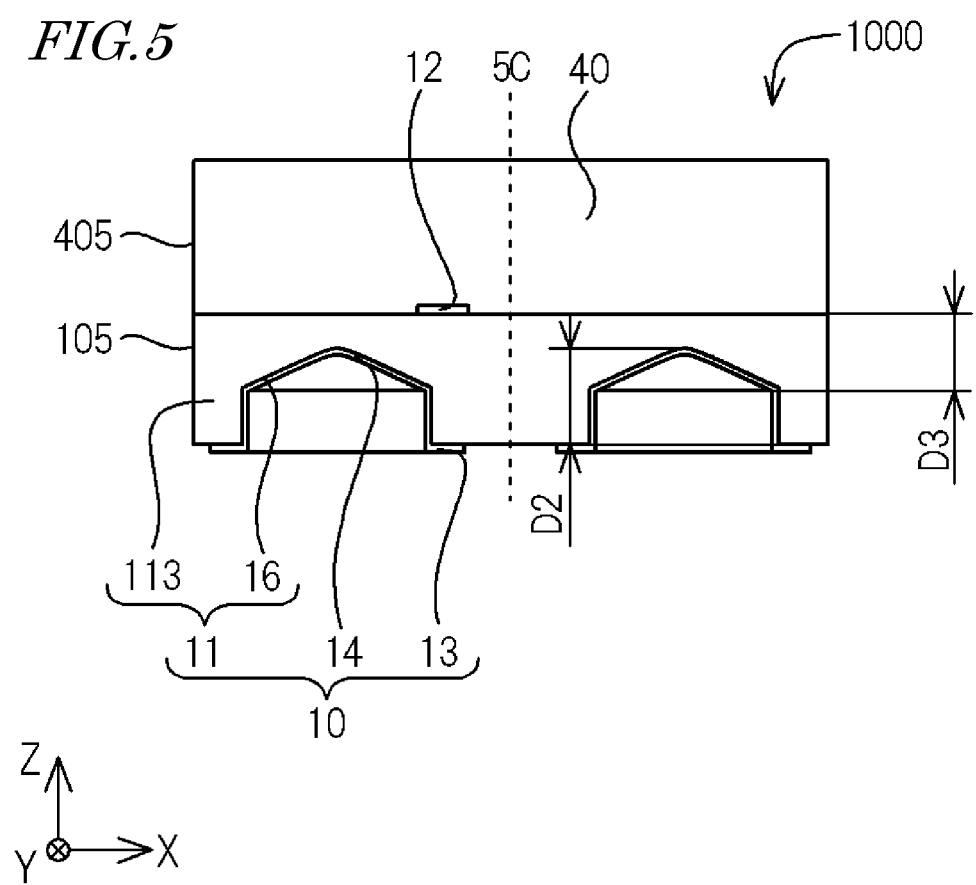

FIG.12E
FIG.12F
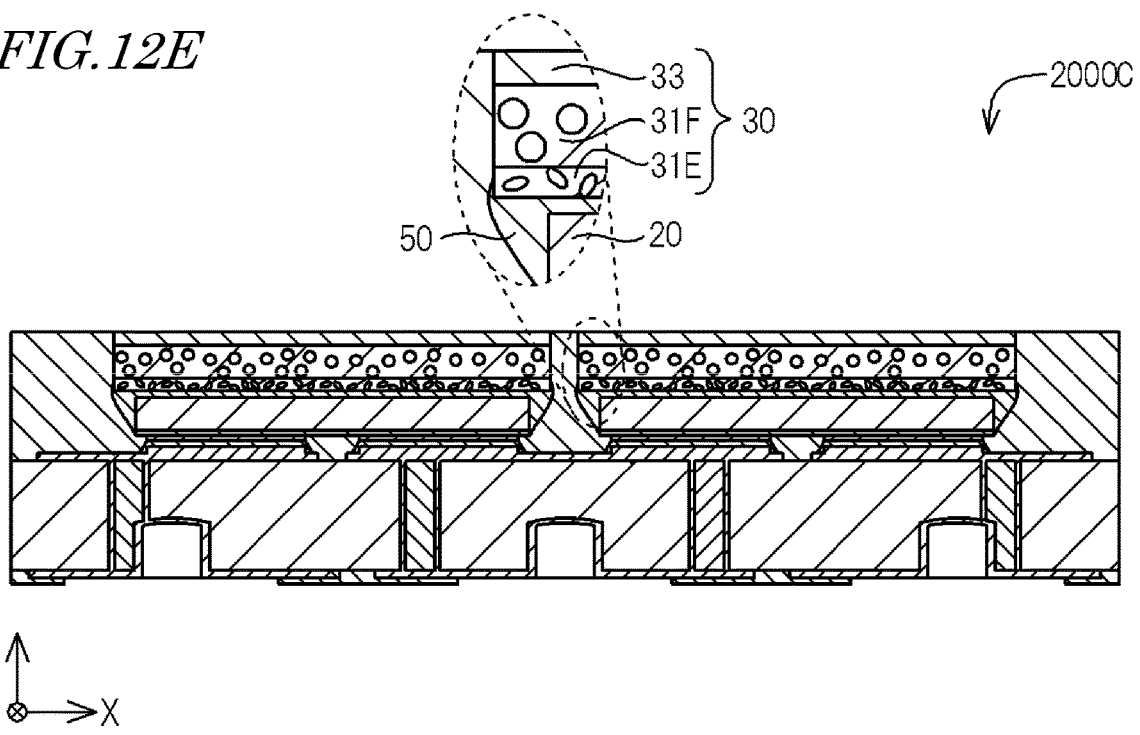
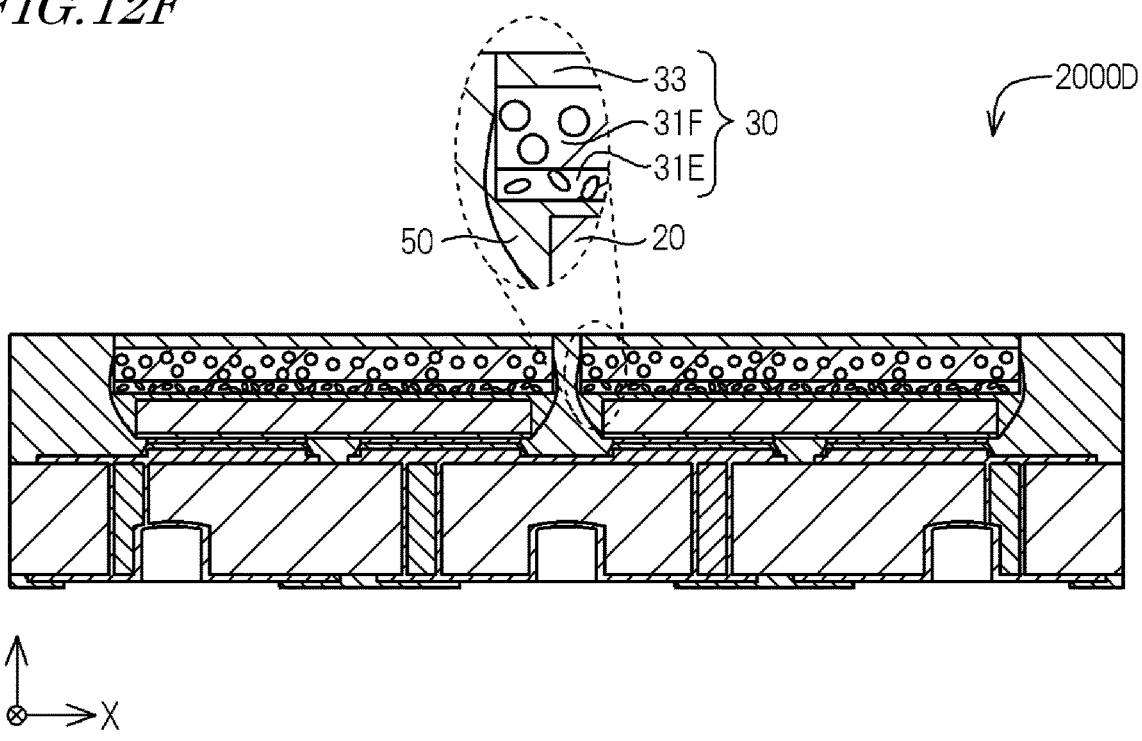

LIGHT EMITTING DEVICE

CROSS-REFERENCE TO RELATED APPLICATION

This application claims priority to Japanese Patent Application No. 2017-246556, filed on Dec. 22, 2017, Japanese Patent Application No. 2018-005345, filed on Jan. 17, 2018, Japanese Patent Application No. 2018-115073, filed on Jun. 18, 2018, and Japanese Patent Application No. 2018-139908, filed on Jul. 26, 2018, the disclosures of which are hereby incorporated by reference in their entireties.

BACKGROUND

The present disclosure relates to a light emitting device.

A light emitting device including a concave-shaped electrode electrically connected with an electrode pattern via a through-hole is known. The concave-shaped electrode of such a light emitting device is electrically connected with an electrode of a motherboard with a solder, and thus the light emitting device is mounted on the motherboard (see, for example, Japanese Patent Publication No. 2012-124191).

SUMMARY

Light emitting elements (LED elements) are increased in output level, and accordingly, heat generated from the light emitting elements is increased. In such a situation, a light emitting device with improved heat dissipation is now desired. Certain non-limiting and exemplary embodiment herein provides a light emitting device with improved heat dissipation.

A light emitting device in certain embodiment according to the present disclosure includes a substrate, a light emitting element, and a first reflective member. The substrate includes a base member, a first wiring portion, a second wiring portion, and a third wiring portion. The base member includes a front surface extending in a first direction as a longer direction and a second direction as a shorter direction, a rear surface located opposite to the front surface, a bottom surface adjacent to and perpendicular to the front surface, and a top surface located opposite to the bottom surface. The first wiring portion is located on the front surface, and the second wiring portion is located on the rear surface. The light emitting element is electrically connected with the first wiring portion and placed on the first wiring portion. The first reflective member covers a lateral surface of the light emitting element and the front surface of the base member. The base member has a recessed portion opened on the rear surface and the bottom surface. The third wiring portion covers an inner wall of the recessed portion, and is electrically connected with the second wiring portion. The base member has a via in contact with the first wiring portion, the second wiring portion, and the third wiring portion.

According to the above aspect, it is possible to provide a light emitting device with improved heat dissipation.

BRIEF DESCRIPTION OF THE DRAWINGS

FIG. 2A is a schematic cross-sectional view of the light emitting device taken along line 2A-2A in FIG. 1C.

FIG. 2B is a schematic cross-sectional view of the light emitting device taken along line 2B-2B in FIG. 1C.

FIG. 5 is a schematic bottom view of the light emitting device according to embodiment 1.

FIG. 12E is a schematic cross-sectional view of a light emitting device according to still another modification of embodiment 2.

FIG. 12F is a schematic cross-sectional view of a light emitting device according to yet another modification of embodiment 2.

DETAILED DESCRIPTION

Figure 1A:
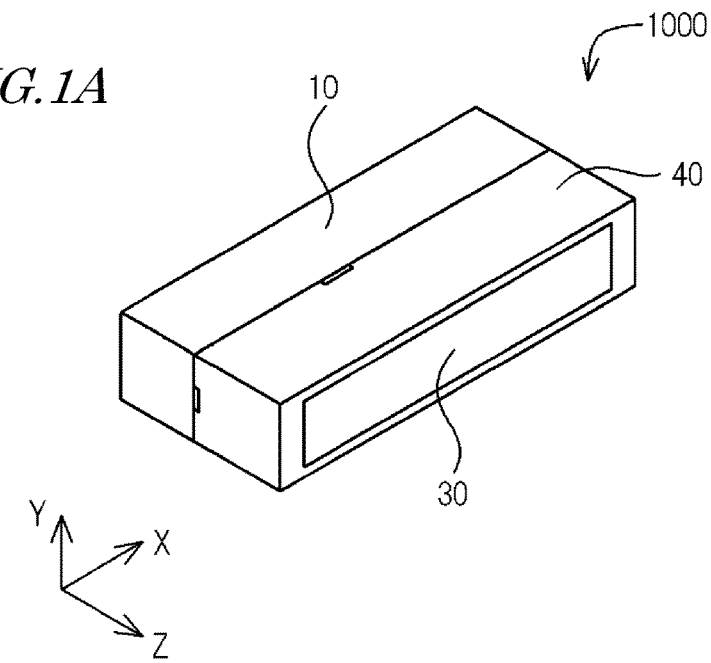
FIG. 1A is a schematic perspective view of a light emitting device according to embodiment 1 of the present disclosure.
Figure 1B:
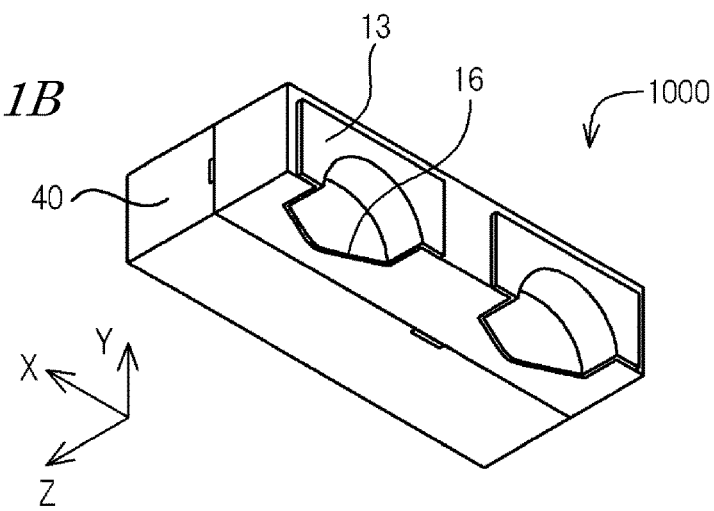
FIG. 1B is a schematic perspective view of the light emitting device according to embodiment 1.
Figure 1C:
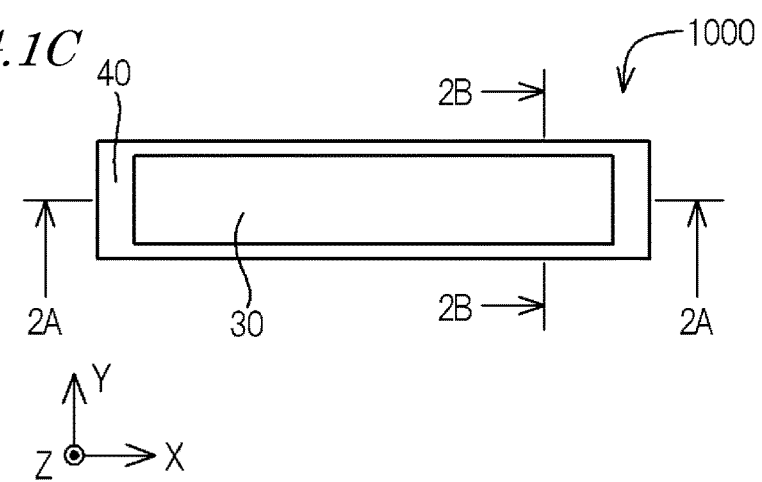
FIG. 1C is a schematic front view of the light emitting device according to embodiment 1.

Hereinafter, embodiments of the present disclosure will be described with reference to the drawings when necessary. Light emitting devices described below embody the technological idea of the present invention, and the present invention is not limited to any of the following embodiments unless otherwise specified. A content described in one embodiment is applicable to other embodiments and modifications. In the drawings, the size, positional relationship or the like may be emphasized for clear illustration.

Embodiment 1

A light emitting device 1000 in embodiment 1 according to the present disclosure will be described with reference to FIG. 1A through FIG. 8. The light emitting device 1000 includes a substrate 10, at least one light emitting element 20, and a first reflective member 40. The substrate 10 includes a base member 11, at least one first wiring portion 12, at least one second wiring portion 13, at least one third wiring portion 14, and at least one via 15. The base member 11 includes a front surface 111 extending in a first direction, which is a longer direction, and a second direction, which is a shorter direction, a rear surface 112 located opposite to the front surface 111, a bottom surface 113 adjacent to, and perpendicular to, the front surface 111, and a top surface 114 located opposite to the bottom surface 113. In this example, as shown in e.g., FIG. 1C, the first direction coincides an X direction and the second direction coincides a Y direction. The base member 11 includes at least one recessed portion 16. The first wiring portions 12 are located on the front surface 111 of the base member 11. The second wiring portion 13 is located on the rear surface 112 of the base member 11. The light emitting element 20 is electrically connected with the first wiring portions 12 and is located on the first wiring portions 12. The first reflective member 40 covers a lateral surface 202 of the light emitting element 20 and the front surface 111 of the base member 11. The at least one recessed portion 16 is opened at the rear surface 112 and the bottom surface 113. The third wiring portion 14 covers an inner wall of the recessed portion 16, and is electrically connected with the second wiring portion 13. The via 15 is in contact with the first wiring portion 12, the second wiring portion 13 and the third wiring portion 14. The via 15 electrically connects the first wiring portion 12, the second wiring portion 13 and the third wiring portion 14 to each other. The via 15 runs through the base member 11 from the front surface 111 to the rear surface 112. In this specification, the term "perpendicular" indicates that a tolerance of ±3 degrees from 90 degrees is allowed.

Figure 3:
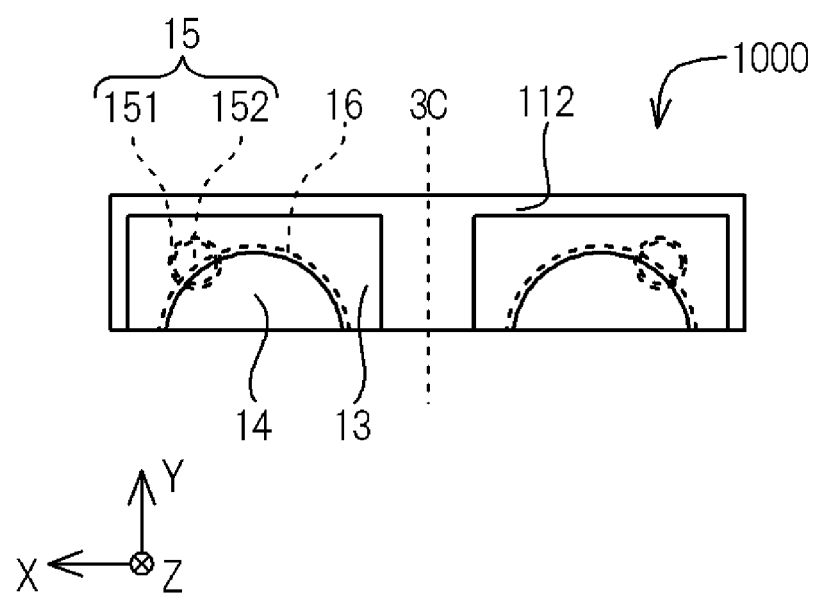
FIG. 3 is a schematic rear view of the light emitting element according to embodiment 1.

The via 15 may be in contact with the first wiring portion 12, the second wiring portion 13 and the third wiring portion 14. With such a structure, heat from the light emitting element 20 is transmitted to the second wiring portion 13 and/or the third wiring portion 14 through the via 15, and whereby heat dissipation of the light emitting device 1000 can be improved. In the case where the via 15 is in contact with the second wiring portion 13 and the third wiring portion 14, as shown in FIG. 3, the via 15 overlaps the second wiring portion 13 and the third wiring portion 14 as seen in a rear view. In the case where the substrate 10 has a plurality of the vias 15, all the plurality of vias 15 may each be in contact with the first wiring portion 12, the second wiring portion 13 and the third wiring portion 14. Alternatively, all the plurality of vias 15 do not need to be in contact with the first wiring portion 12, the second wiring portion 13 and the third wiring portion 14. In the case where, for example, the substrate 10 has the plurality of vias 15, one of the vias 15 may be in contact with one of the first wiring portions 12, one of the second wiring portions 13 and one of the third wiring portions 14 whereas another of the vias 15 may be in contact with another one of the first wiring portions 12 and another one of the second wiring portions 13 but out of contact with another one of the third wiring portions 14. A part of the plurality of vias 15 may be in contact with the first wiring portion 12, the second wiring portion 13 and the third wiring portion 14, so that heat dissipation of the light emitting device 1000 can be improved. The via 15 is preferably circular as seen in a rear view. With such a structure, the via 15 is easily formed by drilling or the like. In the case where the via 15 is circular as seen in a rear view, the via 15 preferably has a diameter of 100 μm or greater and 150 μm or smaller. The structure in which the diameter of the via 15 is 100 μm or greater can improve heat dissipation of the light emitting device 1000. The structure in which the diameter of the via 15 is 150 μm or smaller can mitigate a decrease in the strength of the substrate 10. In this specification, the term "circle" encompasses a true circle and also a shape close to circle (e.g., an ellipse and a quadrangle with four rounded corners). It is preferable that as seen in a rear view, an area size of the via 15 overlapping the second wiring portion 13 is larger than an area size of the via 15 overlapping the third wiring portion 14. Such a structure can increase the volumetric capacity of the via 15, and thus can improve heat dissipation of the light emitting device 1000. It is preferable that the via 15 is located at the center of the substrate 10 in a Y direction for the following reason. A portion of the base member 11 from an end of the via 15 to an end of the base member 11 in the Y direction is thinner than the rest of the area of the base member 11. However, in the case where the via 15 is formed at the center of the base member 11 in the Y direction, an area size of such a thinner portion is decreased. This can increase the strength of the base member 11.

Figure 4A:
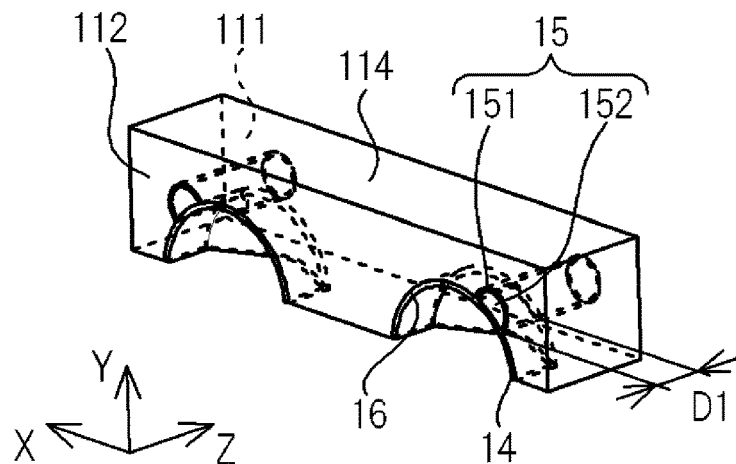
FIG. 4A is a schematic perspective view of a base member, vias and a third wiring portion according to embodiment 1.
Figure 4B:
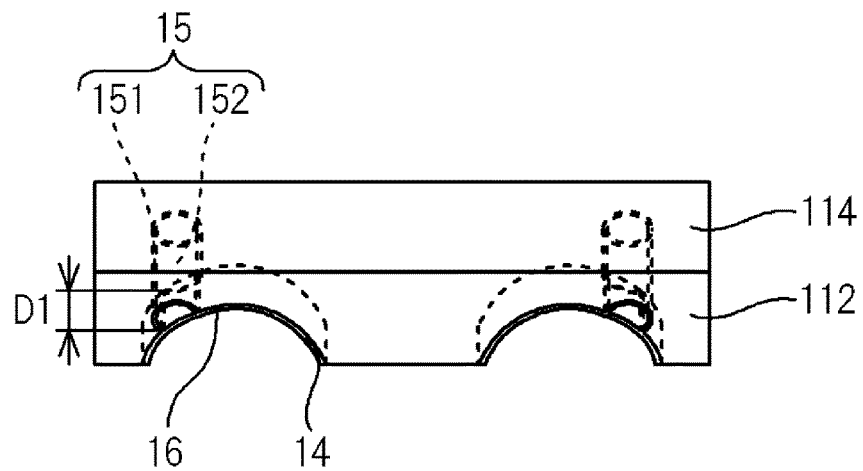
FIG. 4B is a schematic perspective view of the base member, the vias and the third wiring portion according to embodiment 1.
Figure 4C:
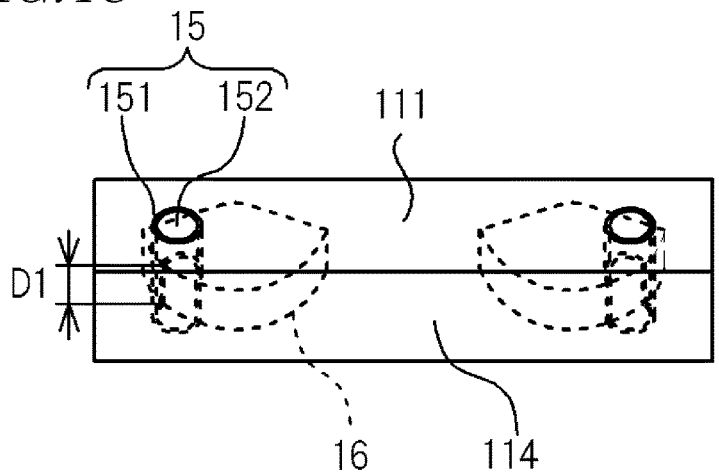
FIG. 4C is a schematic perspective view of the base member, the vias and the third wiring portion according to embodiment 1.

As shown in FIG. 4A through FIG. 4C, the via 15 includes a portion D1, which extends in a direction from the rear surface 112 to the front surface 111 (i.e., Z direction) and in which the via 15 partially overlaps with the third wiring portion 14 as seen from the rear surface. With such a structure, the via 15 and the third wiring portion 14 are in contact with each other in the X direction and the Y direction as well as in the Z direction (i.e., direction from the rear surface 112 to the front surface 111). This can increase the contact area size of the via 15 and the third wiring portion 14. With such a structure, the heat from the light emitting element 20 is easily transmitted from the first wiring portion 12 to the third wiring portion 14 through the via 15, and thus heat dissipation of the light emitting device 1000 can be improved.

The light emitting device 1000 may be secured to a mounting substrate with a joining member such as a solder member or the like formed in the recessed portion 16. The third line 14 covering the inner wall of the recessed portion 16 may undesirably be subject to a force caused by thermal expansion of the joining member, or the like. With the via 15 including the portion D1, which extends in the Z direction and in which the via 15 and the third wiring portion 14 are in contact with each other, the joining strength between the via 15 and the third wiring portion 14 can be increased. Accordingly, the third wiring portion 14 is less likely to delaminate from the base member 11 even if the force caused by the joining member or the like due to thermal expansion is applied to the third wiring portion 14.

The via 15 may include a conductive member which fills a through-hole formed in the base member 11. Alternatively, as shown in FIG. 2A, the via 15 may include a fourth wiring 151 covering an inner surface of the through-hole in the base member 11 and a filling member 152 filling a space enclosed by the fourth wiring 151. The filling member 152 may be conductive or insulating. The filling member 152 is preferably formed of a resin material. In general, a pre-cured resin material has a higher fluidity than that of a pre-cured metal material, and therefore, easily fills the space enclosed by the fourth wiring 151. Such use of a resin material for the filling member 152 can make it easier to form the substrate 10. A resin material that easily fills the space enclosed by the fourth wiring 151 may be, for example, an epoxy resin. In the case where a resin material is used for the filling member 152, the resin material preferably contains at least one additive in order to decrease a linear thermal expansion coefficient. Such a manner can decrease the difference in the linear thermal expansion coefficients between the filling member 152 and the fourth wiring 151, and thus a gap, which might be generated by the heat from the light emitting element, is less likely to be formed between the fourth wiring 151 and the filling member 152. The additive to be contained may be, for example, silicon oxide. In the case where the filling member 152 is formed of a material comprising a metal, the heat dissipation can be improved. In the case where the via 15 includes a conductive member filling the through-hole formed in the base member 11, it is preferable that the conductive member is formed of material comprising a metal having a high heat conductivity such as Ag, Cu or the like.

The substrate 10 may have one recessed portion 16, or a plurality of the recessed portions 16. In the case where the substrate 10 has the plurality of recessed portions 16, the joining strength between the light emitting device 1000 and the mounting substrate can be increased. The recessed portion 16 has a depth W3 defined from the rear surface 112 to the front surface 111 on the bottom surface 113 side, and a depth W4 defined from the rear surface 112 to the front surface 111 on the top surface 114 side. The depths on the top surface 114 side and the bottom surface 113 side may be equal, or may be deeper on the bottom surface 113 side than on the top surface 114 side. In the case where as shown in FIG. 2B, the recessed portion 16 is deeper in the Z direction on the bottom surface 113 side than on the top surface 114 side, thickness W1 of a portion of the base member 11 that is located on the top surface 114 side with respect to the recessed portion 16 is greater than thickness W2 of a portion of the base member 11 that is located on the bottom surface 113 side with respect to the recessed portion 16. This can mitigate a decrease in the strength of the base member. In addition, depth W3 of the recessed portion 16 on the bottom surface 113 side is greater than depth W4 of the recessed portion 16 on the top surface 114 side. This can increase the volume of the joining member formed in the recessed portion 16. Therefore, the joining strength between the light emitting device 1000 and the mounting substrate can be enhanced. The light emitting device 1000 may be either of a top view type, in which the rear surface 112 of the base member 11 and the mounting substrate face each other, or of a side view type, in which the bottom surface 113 of the base member 11 and the mounting substrate face each other. In either case, the increase in the volume of the joining member can enhance the joining strength between the light emitting device 1000 and the mounting substrate.

The joining strength between the light emitting device 1000 and the mounting substrate can be increased especially in the case where the light emitting device 1000 is employed as the side view type. Because the recessed portion 16 is deeper in the Z direction on the bottom surface 113 side than on the top surface 114 side, the surface area size of the opening of the recessed portion 16 at the bottom surface 113 cab be large. Because the surface area size of the opening of the recessed portion 16 is large at the bottom surface 113, which faces the mounting substrate, the surface area size of the joining member located on the bottom surface 113 can also be large. In this manner, the surface area size of the joining member located on the surface facing the mounting substrate can be increased. This can increase the joining strength between the light emitting device 1000 and the mounting substrate.

It is preferred that the maximum depth of the recessed portion 16 in the Z direction is 0.4 to 0.9 times the thickness of the base member 11 in the Z direction. With the structure in which the depth of the recessed portion 16 is equal to or larger than 0.4 times the thickness of the base member 11, the volume of the joining member formed in the recessed portion 16 can be increased. This can increase the joining strength between the light emitting device 1000 and the mounting substrate. With the structure in which the depth of the recessed portion 16 is equal to or smaller than 0.9 times the thickness of the base member 11, the strength of the base member is less likely to be decreased.

As shown in FIG. 2B, it is preferable that the recessed portion 16 includes a parallel portion 161 extending from the rear surface 112 in a direction parallel to the bottom surface 113 (in the Z direction). The provision of the parallel portion 161 can increase the area size of the portion D1 (FIGS. 4A through 4C), which extends in the Z direction and in which the via 15 and the third wiring portion 14 are in contact with each other. This improves the level of heat dissipation of the light emitting device 1000. The provision of the parallel portion 161 can also increase the volume of the recessed portion 16 even if the surface area size of the opening of the recessed portion 16 at the rear surface 112 is the same as in the case where the parallel portion 161 is not provided. Such an increased volumetric capacity of the recessed portion 16 can increase the amount of the joining member (e.g., a solder member or the like) to be supplied in the recessed portion 16. Accordingly, the joining strength can be enhanced between the light emitting device 1000 and the mounting substrate. In this specification, the term "parallel" indicates that a tolerance of about ±3 degrees is allowed. As seen in a cross-sectional view, the recessed portion 16 includes an inclining portion 162 inclining so as to increase the thickness of the base member 11 from the bottom surface 113. The inclining portion 162 may be defined by a straight line or a curved line.

It is preferred that the recessed portion 16 has a maximum height in the Y direction that is 0.3 times to 0.75 times the thickness of the base member 11 in the Y direction. With the structure in which the length of the recessed portion 16 in the Y direction is equal to or larger than 0.3 times the thickness of the base member 11 in the Y direction, the volume of the joining member formed in the recessed portion 16 can be increased. This can increase the joining strength between the light emitting device 1000 and the mounting substrate. With the structure in which the length of the recessed portion 16 in the Y direction is equal to or smaller than 0.75 times the thickness of the base member 11 in the Y direction, the strength of the base member 11 is less likely to be decreased.

As shown in FIG. 3, it is preferable that the recessed portion 16 is generally semicircular at the rear surface 112. Because the recessed portion 16 at the rear surface 112 is semicircular with no angular portion, a stress is less likely to concentrate to a particular position of the recessed portion. Accordingly, the base member is less likely to be broken. In this specification, the term "semicircle" encompasses a true semicircle and also a shape close thereto (e.g., an semi-ellipse).

As shown in FIG. 3, in the case where there are the plurality of recessed portions 16 at the rear surface 112, it is preferable that the plurality of recessed portions 16 are located in a left-right symmetrical manner with respect to a center line 3C, of the base member 11, parallel to the second direction (i.e., Y direction). With such a structure, when the light emitting device 1000 is mounted on the mounting substrate with the joining member, a self-alignment effect is effectively provided to mount the light emitting device 1000 in a predetermined mounting range with high precision.

At the bottom surface 113, the recessed portion 16 may have a generally constant depth in the Z direction, or the depth may be different between in a central portion and an end portion in the recessed portion 16. It is preferable that as shown in FIG. 5, at the bottom surface 113, depth D2 of the central portion of the recessed portion 16 is the maximum depth of the recessed portion 16 in the Z direction. With such a structure, at the bottom surface 113, thickness D3 of the base member 11 in the Z direction can be larger at an end of the recessed portion 16 in the X direction. This can increase the strength of the base member 11. In this specification, the term "central" indicates that a tolerance of about 5 μm is allowed. The recessed portion 16 may be formed by a known method such as drilling, laser processing or the like.

As shown in FIG. 5, it is preferable that a portion of the first wiring portion 12 exposed to an outer lateral surface of the light emitting device 1000, more specifically, an outer lateral surface of the first reflective member 40, is located either to the left of, or to the right of, a center line 5C, of the base member 11, parallel to Z direction. With such a structure, the polarity of the light emitting device 1000 can be recognized based on the position of that portion of the first wiring portion 12. Alternatively, the first wiring portions 12 may have two portions which are exposed to the outer lateral surface of the light emitting device 1000, and those two portions may be located each to the left of, and to the right of, the center line 5C. In this case, it is preferable that the one located to the left of the center line 5C and the other located to the right of the center line 5C have different shapes from each other on the outer lateral surface of the light emitting device 1000, more specifically, the outer lateral surface of the first reflective member 40. With such a structure, the polarity of the light emitting device 1000 can be recognized based on the shape of the first wiring portion 12 on each of the above-described positions on the outer lateral surface of the light emitting device 1000.

Figure 6A:
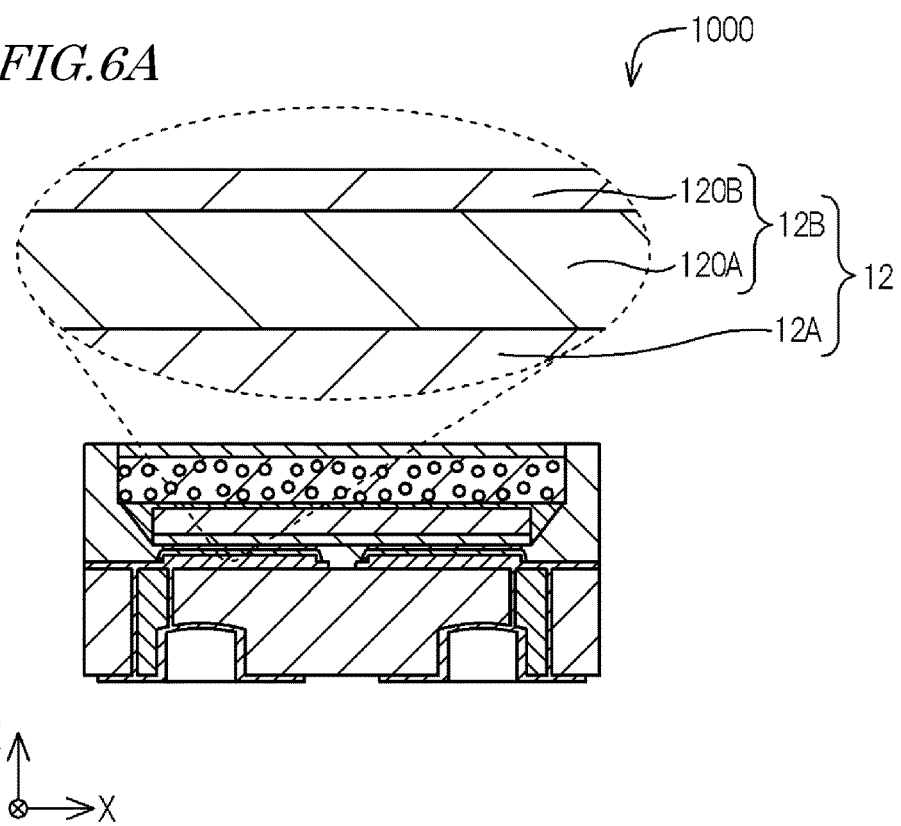
FIG. 6A is a schematic cross-sectional view of the light emitting device according to embodiment 1, also showing an enlarged view of a portion enclosed by the dashed line.

As shown in FIG. 6A, the first wiring portion 12, the second wiring portion 13 and/or the third wiring portion 14 may each include a wiring main portion 12A and a plating portion 12B formed on the wiring main portion 12A. In this specification, the term "wiring" refers to the first wiring portion 12, the second wiring portion 13 and/or the third wiring portion 14. The wiring main portion 12A may be formed of at least one known material such as copper or the like. The provision of the plating portion 12B on the wiring main portion 12A can increase the reflectance of a surface of each wiring or can mitigate sulfurization of wiring. For example, a phosphorus-containing nickel plating portion 120A may be included in the plating portion 12B as a portion provided on the wiring main portion 12A. Nickel that contains phosphorus has an increased hardness. Therefore, the provision of the phosphorus-containing nickel plating portion 120A on the wiring main portion 12A can increase the hardness of the wiring. Accordingly, burr is less likely to be generated on the wiring when the wiring is cut in order to, for example, singulate the light emitting devices into individual pieces. The phosphorus-containing nickel plating portion 120A may be formed by electrolytic plating or electroless plating.

As shown in FIG. 6A, it is preferable that the plating portion 12B includes a gold plating portion 120B at an outermost surface thereof. The provision of the gold plating portion 120B at the outermost surface of the plating portion 12B can mitigate oxidation and corrosion of the surface of the first wiring portion 12, the second wiring portion 13 and/or the third wiring portion 14, and thus provides a high solderability. This can also increase the reflectance of the surface of each wiring or mitigate sulfurization of the wiring. It is preferable that the gold plating portion 120B located at the outermost surface of the plating portion 12B is formed by electrolytic plating. By employing the electrolytic plating, the amount of catalyst poison such as sulfur or the like can be smaller than in the case where the electroless plating is employed. An addition reaction type silicone resin formed by using a platinum-based catalyst may be cured while being in contact with the gold plating portion 120B. In this case, the gold plating portion 120B, when being formed by electrolytic plating, contains little sulfur and thus can mitigate reaction of sulfur and platinum. This can mitigate an insufficient curing of the addition reaction type silicone resin formed by using a platinum-based catalyst. In the case where the gold plating portion 120B is formed in contact with the phosphorus-containing nickel plating portion 120A, it is preferable that the phosphorus-containing nickel plating portion 120A and the gold plating portion 120B are formed by electrolytic plating. The different types of plating portions may be formed by the same plating method, so that the production cost of the light emitting device 1000 can be reduced. The "nickel plating portion" may contain any other material as long as containing nickel. The "gold plating portion" may contain any other material as long as containing gold.

It is preferable that the phosphorus-containing nickel plating portion 120A is thicker than the gold plating portion 120B. With the structure in which the phosphorus-containing nickel plating portion 120A is thicker than the gold plating portion 120B, the hardness of the first wiring portion 12, the second wiring portion 13 and/or the third wiring portion 14 can be easily increased. The thickness of the phosphorus-containing nickel plating portion 120A is preferably in the range of from at least 5 times to at most 500 times the thickness of the gold plating portion 120B, and more preferably in the range of from at least 10 times to at most 100 times the thickness of the gold plating portion 120B.

Figure 6B:
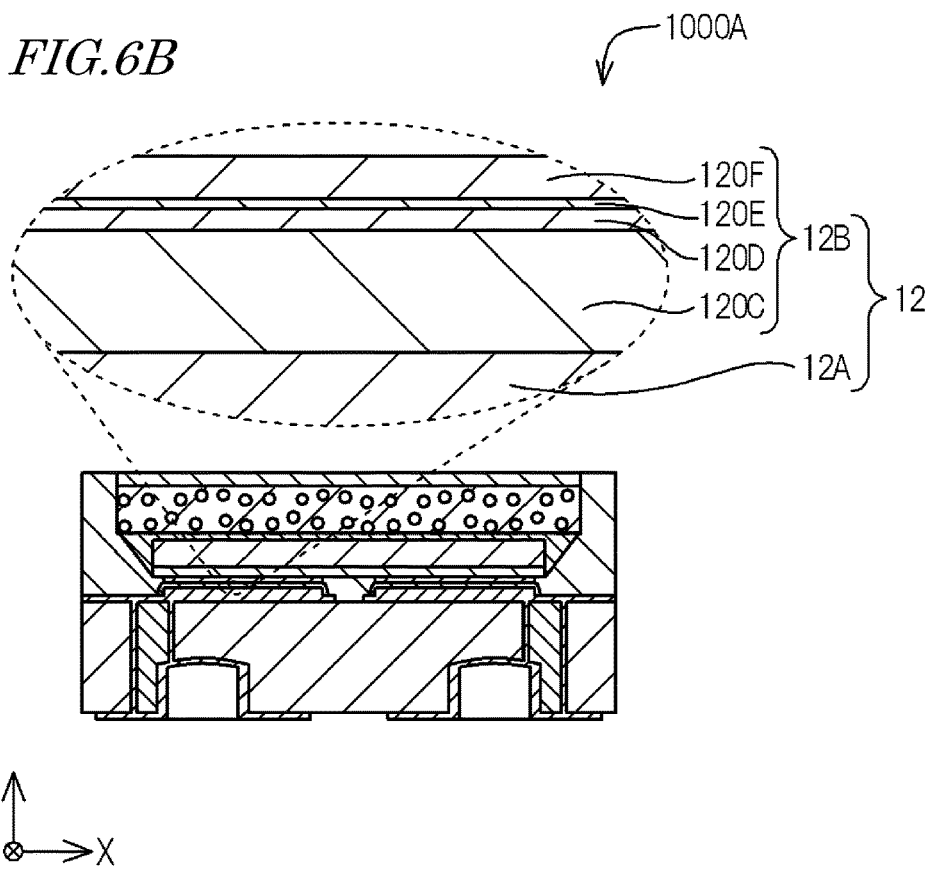
FIG. 6B is a schematic cross-sectional view of a light emitting device according to a modification of embodiment 1, also showing an enlarged view of a portion enclosed by the dashed line.

As in a light emitting device 1000A shown in FIG. 6B, the plating portion 12B formed on the wiring main portion 12A of wiring may include a phosphorus-containing nickel plating portion 120C, a palladium plating portion 120D, a first gold plating portion 120E and a second gold plating portion 120F as layered structure. In the case where, for example, the wiring main portion 12A is formed of copper, the layers of the phosphorus-containing nickel plating portion 120C, the palladium plating portion 120D, the first gold plating portion 120E and the second gold plating portion 120F can mitigate diffusion of copper in the plating portion 12B. This can mitigate a decrease in the adhesiveness between the layers of plating. The phosphorus-containing nickel plating portion 120C, the palladium plating portion 120D and the first gold plating portion 120E may be formed by electroless plating on the wiring main portion 12A, whereas the second gold plating portion 120F may be formed by electrolytic plating. The second gold plating portion 120F formed by electrolytic plating may be located at the outermost surface, thereby mitigating an insufficient curing of the addition reaction type silicone resin formed by using a platinum-based catalyst.

As shown in FIG. 2A, the light emitting element 20 includes a mounting surface facing the substrate 10 and a light extraction surface 201 located opposite to the mounting surface. The light emitting element 20 includes at least a semiconductor layered body 23, and positive and negative electrodes 21 and 22 are provided on the semiconductor layered body 23. It is preferable that the positive and negative electrodes 21 and 22 are formed on/above the same surface of the light emitting element 20, and that the light emitting element 20 is flip-chip-mounted on the substrate 10. Such a structure does not require a wire that supplies electricity to the positive and negative electrodes 21 and 22 of the light emitting element 20, and thus can decrease the size of the light emitting device 1000. In the case where the light emitting element 20 is flip-chip-mounted, the light extraction surface 201 is opposite to an electrode formation surface 203, on which the positive and negative electrodes 21 and 22 are located. In this specification, the light emitting element 20 includes an element substrate 24, but the element substrate 24 may be absent. In the case where the light emitting element 20 is flip-chip-mounted on the substrate 10, the positive and negative electrodes 21 and 22 of the light emitting element 20 are connected with the first wiring portion 12 via a conductive bonding member 60.

Figure 7A:
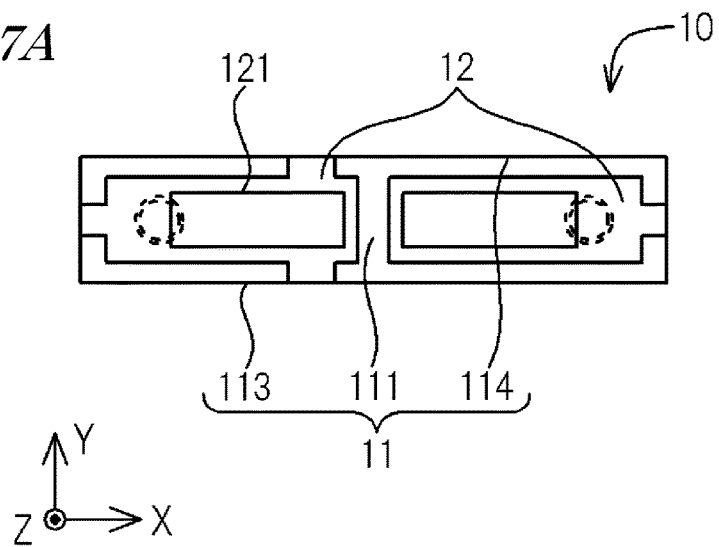
FIG. 7A is a schematic front view of a substrate according to embodiment 1.

As shown in FIG. 2A and FIG. 7A, in the case where the light emitting element 20 is flip-chip-mounted on the substrate 10, it is preferable that the first wiring portion 12 includes at least one protrusion 121 at positions each overlapping the positive and negative electrodes 21 and 22 of the light emitting element 20 as seen in a front view. With the structure in which the first wiring portions 12 each include the protrusion 121, when the first wiring portions 12 are connected with the electrodes 21 and 22 of the light emitting element 20 via the conductive bonding member 60, the positional alignment between the light emitting element 20 and the substrate 10 is easily realized by a self-alignment effect.

Figure 7B:
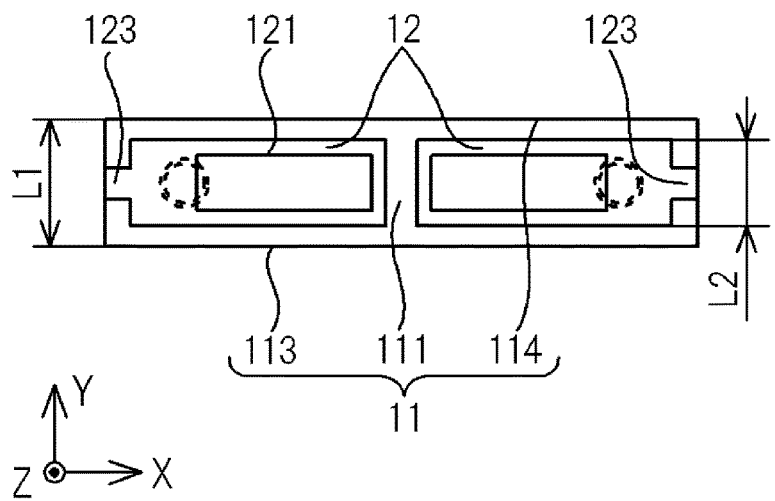
FIG. 7B is a schematic front view of a substrate according to another modification of embodiment 1.
Figure 7C:
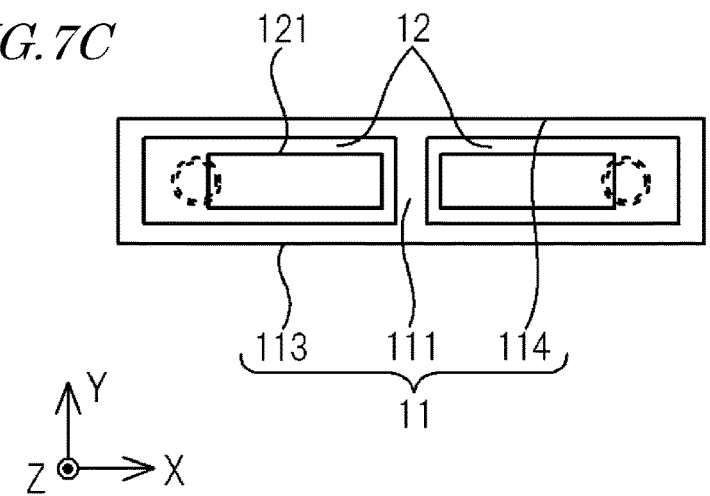
FIG. 7C is a schematic front view of a substrate according to a modification of embodiment 1.

As shown in FIG. 7B, one or both of the first wiring portions 12 may include a wiring extending portion 123 extending in the X direction as seen in a front view. Alternatively, as shown in FIG. 7C, the first wiring portions 12 do not need to include the wiring extending portion 123 extending in the X direction as seen in a front view. The term "wiring extending portion" refers to a portion that is narrower, as seen in a front view, than the rest of the first wiring portions 12 overlapping the light emitting element 20 and extends from the rest of the first wiring portions 12 overlapping the light emitting element 20. In the case where the wiring extending portion extends in the X direction, the "width of the wiring extending portion" refers to the size of the wiring extending portion in the Y direction and the "width of the part of the first wiring portion 12 overlapping the light emitting element 20" refers to the size in the Y direction of the part of the first wiring portion 12 where the light emitting element 20 overlaps. In the case where the wiring extending portion extends in the Y direction (see FIG. 7A), the "width of the wiring extending portion" refers to the size of the wiring extending portion in the X direction and the "width of the part of the first wiring portion 12 overlapping the light emitting element 20" refers to the size in the X direction of the part of the first wiring portion 12 where the light emitting element 20 overlaps. The wiring extending portion 123 may extend to an outer edge of the base member 11 as seen in a front view, or an end of the wiring extending portion 123 may be apart from the outer edge of the base member 11 as seen in a front view. In the case where, as seen in a front view, the wiring extending portion 123 is formed to extend in an X+ direction and/or an X− direction from the position where the light emitting element 20 is to be placed, the light emitting element 20 may be placed on the substrate 10 by using the wiring extending portion 123 as a mark. This makes it easy to place the light emitting element 20 on the substrate 10. The X+ direction is defined as a direction from left to right on an X axis as seen in a front view, whereas the X− direction is defined as a direction opposite to the X+ direction.

The first wiring portions 12 may each include one wiring extending portion 123 or a plurality of wiring extending portions 123 or no wiring extending portion 123. In the case where the first wiring portions 12 includes the plurality of wiring extending portions 123, it is preferable that the wiring extending portions 123 are located on both of two sides of the light emitting element 20 in the X direction. This allows the light emitting element 20 to be placed by using the wiring extending portions 123 located on both of the two sides of the light emitting element 20 as marks, and thus can improve the positional precision at which the light emitting element 20 is placed on the substrate 10. In the case where a light-transmissive member is placed on the light emitting element 20, the wiring extending portion may be formed to extend from the position where the light-transmissive member is placed as seen in a plan view. With such a structure, the light-transmissive member can be placed on the light emitting element 20 by using the wiring extending portion as a mark. This makes it easy to place the light-transmissive member on the light emitting element 20.

In the case where the first wiring portion 12 does not include the wiring extending portion 123 extending in the X direction, the contact area size of the base member 11 and a reflective member (e.g., the first reflective member 40) in the X direction can be increased. This can increase the joining strength between the base member 11 and the reflective member (e.g., the first reflective member 40). Moreover, in the case where the first wiring portion 12 does not include the wiring extending portion 123 extending in the X direction, the conductive bonding member 60 is less likely to spread in a wet state onto the wiring extending portion extending in the X direction. This can decrease the area size in which the conductive bonding member 60 spreads in a wet state, and thus the shape of the conductive bonding member 60 can be easily controlled.

As shown in FIG. 7A, the first wiring portion 12 may include the wiring extending portion extending in the Y direction. Alternatively, as shown in FIG. 7B, the first wiring portion 12 does not need to include the wiring extending portion extending in the Y direction. In the case where the first wiring portion 12 includes the wiring extending portion extending in the Y direction, the light emitting element 20 may be placed on the substrate 10 by using the wiring extending portion as a mark. This can improve the positional precision at which the light emitting element 20 is placed on the substrate 10. In the case where the first wiring portion 12 does not include the wiring extending portion extending in the Y direction, the contact area size of the base member 11 and the reflective member (e.g., the first reflective member 40) in the Y direction can be increased. This can increase the joining strength between the base member 11 and the first reflective member 40, for example. In the case where the first wiring portion 12 does not include the wiring extending portion extending in the Y direction, the conductive bonding member 60 is less likely to spread in a wet state onto the wiring extending portion extending in the Y direction. This can decrease the area size in which the conductive bonding member 60 spreads in a wet state, and thus the shape of the conductive bonding member 60 can be easily controlled.

In the case where the wiring 12 does not include the wiring extending portion extending in the Y direction, it is preferred that length L2 (see, FIG. 7B) of the first wiring portion 12 in the Y direction is in the range of from at least 0.3 times to at most 0.9 times length L1 of the base member 11 in the Y direction. With the structure in which the length L2 of the first wiring portion 12 in the Y direction is at least 0.3 times the length L1 of the base member 11 in the Y direction, the area size of the first wiring portion 12 is increased. This can facilitate placement of the light emitting element 20. With the structure in which the length L2 of the first wiring portion 12 in the Y direction is at most 0.9 times the length L1 of the base member 11 in the Y direction, the contact area size of the base member 11 and the first reflective member 40 can be increased. With the structure in which the length L2 of the first wiring portion 12 in the Y direction is at most 0.9 times the length L1 of the base member 11 in the Y direction, the area size in which the conductive bonding member 60 spreads in a wet state on the first wiring portion 12 can be decreased. In the case where the first wiring portion 12 includes the wiring extending portion extending in the Y direction, it is preferable that the length of the first wiring portion 12 in the Y direction, excluding the wiring extending portion extending in the Y direction, is in the range of from at least 0.3 times to at most 0.9 times the length of the base member 11 in the Y direction.

The light emitting device 1000 may include a light-transmissive member 30 covering the light emitting element 20. With the structure in which the light emitting element 20 is covered with the light-transmissive member 30, the light emitting element 20 can be protected against an external stress. The light-transmissive member 30 may cover the light emitting element 20 while the light guide member 50 is located between the light-transmissive member 30 and the light emitting element 20. The light guide member 50 may be located only between the light extraction surface 201 of the light emitting element 20 and the light-transmissive member 30 to fix the light emitting element 20 and the light-transmissive member 30 to each other. Alternatively, the light guide member 50 may cover a region from the light extraction surface 201 to one or more of the lateral surfaces 202 of the light emitting element 20 to fix the light emitting element 20 and the light-transmissive member 30 to each other. The light guide member 50 has a higher light transmittance to light from the light emitting element 20 compared to a light transmittance of the first reflective member 40. Therefore, with the structure in which the light guide member 50 covers the lateral surfaces 202 of the light emitting element 20, light emitted from the lateral surfaces 202 of the light emitting element 20 is easily extracted to the outside of the light emitting device through the light guide member 50. This can improve the light extraction efficiency of the light emitting device.

In the case where the light emitting device 1000 includes the light-transmissive member 30, it is preferable that lateral surfaces of the light-transmissive member 30 are covered with the first reflective member 40. With such a structure, the light emitting device has a high contrast between a light emitting region and a non-light emitting region, namely, has a highly clear border between the light emitting region and the non-light emitting region.

The light-transmissive member 30 may include wavelength conversion particles 32. The wavelength conversion particles 32 absorb at least a part of primary light emitted by the light emitting element 20 and emit secondary light having a wavelength different from that of the primary light. With the structure in which the light-transmissive member 30 contains the wavelength conversion particles 32, the light emitting device 1000 can emit mixed color light, which is a mixture of a color of the primary light emitted by the light emitting element 20 and a color of the secondary light emitted by the wavelength conversion particles 32. In the case where, for example, a blue LED is employed for the light emitting element 20 and a phosphor such as YAG is employed for the wavelength conversion particles 32, the light emitting device can output white light obtained as a result of light mixture which comprises blue light emitted by the blue LED and yellow light emitted by the phosphor excited by the blue light.

The wavelength conversion particles 32 may be dispersed uniformly in the light-transmissive member 30, or may be locally present in the vicinity of the light emitting element 20 rather than the vicinity of a top surface of the light-transmissive member 30. In the case where the wavelength conversion particles 32 are locally present in the vicinity of the light emitting element 20 rather than the vicinity of the top surface of the light-transmissive member 30, even if the light-transmissive member 30 contains the wavelength conversion particles, which are weak against moisture, a matrix 31 of the light-transmissive member 30 serves as a protective layer. This can mitigate deterioration of the wavelength conversion particles 32. As shown in FIG. 2A, the light-transmissive member 30 may include a layer containing the wavelength conversion particles 32 and a layer 33 containing substantially no wavelength conversion particle 32. In the Z direction, the layer 33 containing substantially no wavelength conversion particle 32 is located as an upper layer to the layer containing the wavelength conversion particles 32. With such a structure, the layer 33 containing substantially no the wavelength conversion particle 32 serves as a protective layer. This can mitigate deterioration of the wavelength conversion particles 32. Examples of the wavelength conversion particles weak against moisture include a manganese-activated fluoride-based phosphor. The manganese-activated fluoride-based phosphor emits light having a relatively narrow spectral line width, which is preferable from the point of view of color reproducibility. The expression that "containing substantially no wavelength conversion particle" indicates that unavoidable contamination with the wavelength conversion particles is not eliminated. It is preferable that a content of the wavelength conversion particles in the layer 33 is 0.05% by weight or lower.

The first reflective member 40 covers the lateral surface 202 of the light emitting element 20 and a front surface of the substrate 10. Because the first reflective member 40 covers the lateral surfaces 202 of the light emitting element 20, light traveling in the X direction and/or the Y direction from the light emitting element 20 is reflected by the first reflective member 40 to increase the amount of light traveling in the Z direction.

As shown in FIG. 5, it is preferable that a shorter lateral surface 405, extending in the shorter direction, of the first reflective member 40 and a shorter lateral surface 105, extending in the shorter direction, of the substrate 10 are substantially flush with each other. With such a structure, the width of the light emitting device 1000 in the first direction (i.e., X direction) can be shortened. Thus, the size of the light emitting device 1000 can be decreased.

Figure 8:
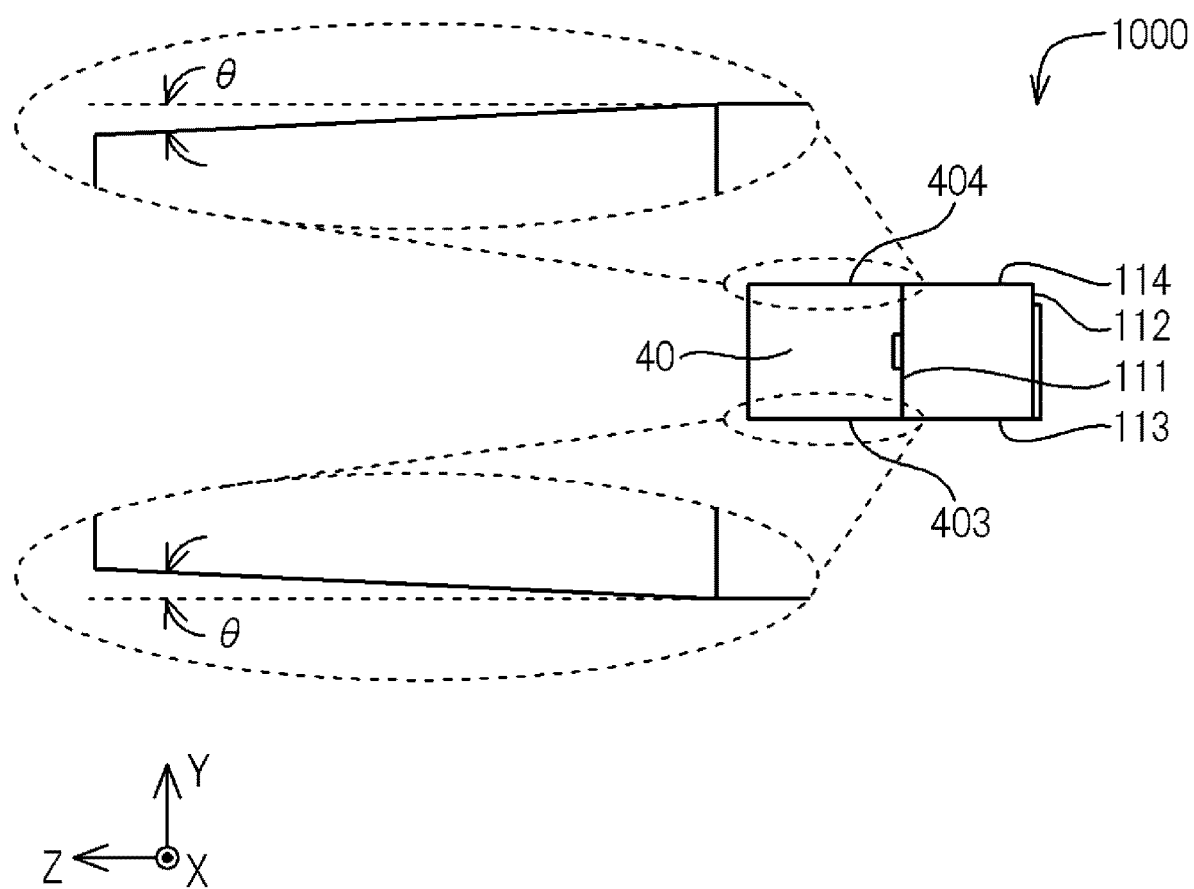
FIG. 8 is a schematic right side view of the light emitting device according to embodiment 1.

As shown in FIG. 8, it is preferable that a longer lateral surface 403, extending in the longer direction, of the first reflective member 40 on the bottom surface 113 side is inclined toward inside of the light emitting device 1000 while extending in the Z direction. With such a structure, when the light emitting device 1000 is mounted on the mounting substrate, the lateral surface 403 of the first reflective member 40 is less likely to be in contact with the mounting substrate. Therefore, the mounting orientation of the light emitting device 1000 tends to be stable. It is preferable that a longer lateral surface 404, extending in the longer direction, of the first reflective member 40 on the top surface 114 side is inclined toward inside of the light emitting device 1000 while extending in the Z direction. With such a structure the lateral surface 404 of the first reflective member 40 is less likely to be contact with a collet (i.e., suction hole), and thus the first reflective member 40 is less likely to be damaged when the light emitting device 1000 is sucked by the collet. As can be seen from the above description, it is preferable that the longer lateral surface 403 of the first reflective member 40 on the bottom surface 113 side, and the longer lateral surface 404 of the first reflective member 40 on the top surface 114 side, are inclined inward in the light emitting device 1000 while extending from the rear surface 112 toward the front surface 111 (while extending in the Z direction). The inclination angle θ of the first reflective member 40 may be appropriately selected. In terms of ease of providing the above-described effects and of the strength of the first reflective member 40, the inclination angle θ is preferably in the range of from 0.3 degrees to 3 degrees, more preferably in the range of from 0.5 degrees to 2 degrees, and still more preferably in the range of from 0.7 degrees to 1.5 degrees. It is preferable that a right lateral surface and a left lateral surface of the light emitting device 1000 have generally the same shape as each other. Such a structure can decrease the size of the light emitting device 1000.

Embodiment 2

Light emitting devices in embodiment 2 according to the present disclosure shown in FIG. 9A through FIG. 12K are different from the light emitting device 1000 in embodiment 1 in the number of the light emitting elements placed on the substrate 10, the number of the recessed portions 16 and the vias 15 formed in the base member 11 and whether at least one insulating film 18 is included or not.

Figure 10:
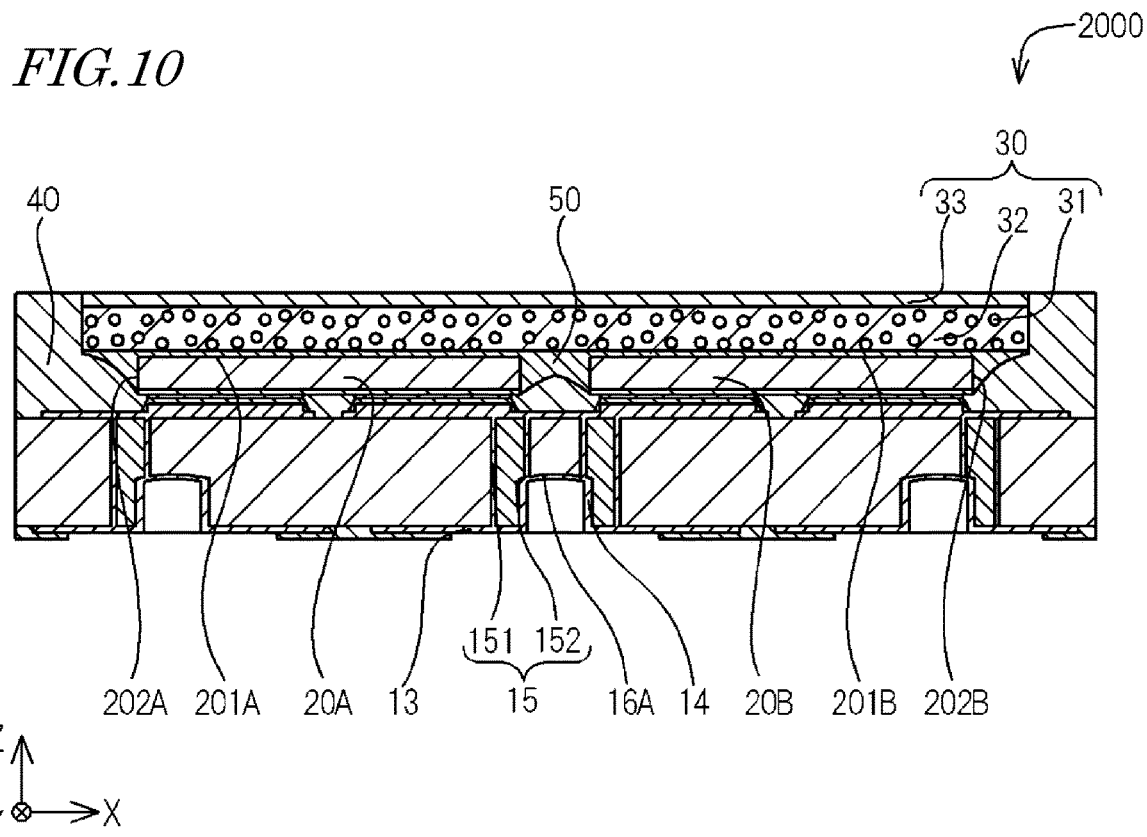
FIG. 10 is a schematic cross-sectional view of the light emitting device taken along line 10A-10A in FIG. 9C.

As shown in FIG. 10, a light emitting device 2000 includes a first light emitting element 20A and a second light emitting element 20B. The first light emitting element 20A and the second light emitting element 20B may have the same emission peak wavelength as, or different emission peak wavelengths from, each other. In the case where the emission peak wavelength of the first light emitting element 20A and the emission peak wavelength of the second light emitting element 20B are different from each other, it is preferable that the emission peak wavelength of the first light emitting element 20A is in the range of 430 nm or longer and shorter than 490 nm (i.e., wavelength range of blue light), and that the emission peak wavelength of the second light emitting element 20B is in the range of 490 nm or longer and 570 nm or shorter (i.e., wavelength range of green light). With such an arrangement, the light emitting device 2000 has an increased color rendering properties.

Figure 11:
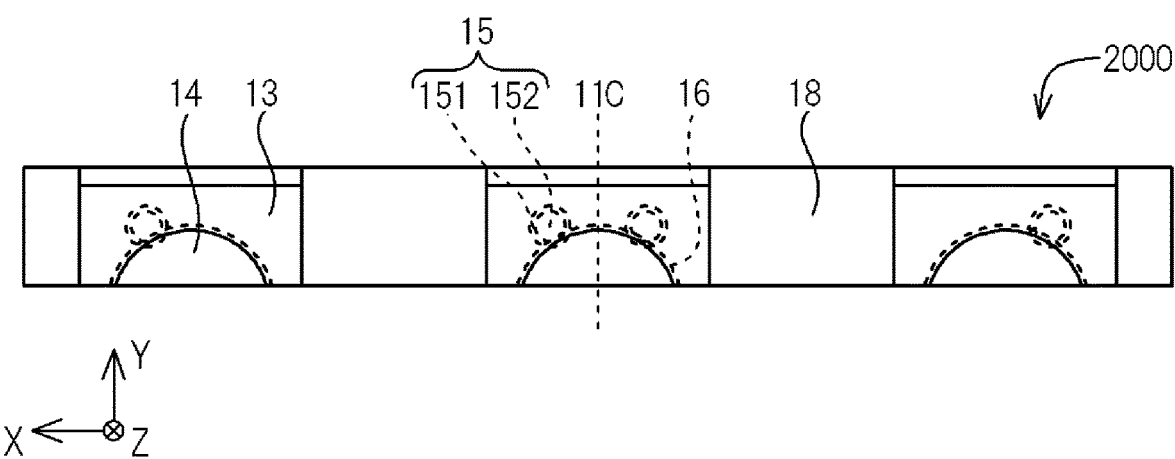
FIG. 11 is a schematic rear view of the light emitting device according to embodiment 2.

As shown in FIG. 10, the vias 15 are each in contact with the first wiring portion 12, the second wiring portion 13 and the third wiring portion 14. Such a structure can improve heat dissipation of the light emitting device 2000. One of the third wiring portion 14 located in one of the recessed portions 16 may be in contact with one of the vias 15 or with the plurality of vias 15. In the case where the third wiring portions 14 are in contact with the plurality of vias 15, heat dissipation of the light emitting device 2000 can be further improved. In the case where as shown in FIG. 11, one of the third wiring portions 14 located in one of the recessed portions 16 is in contact with two of the vias 15, the two of the vias 15 may be located in a left-right symmetrical manner with respect to a center line 11C of the recessed portion 16, which is a line parallel to the second direction (i.e., Y direction).

In the case where the light emitting device includes a plurality of the light emitting elements (the first light emitting element 20A and the second light emitting element 20B), it is preferable that the plurality of light emitting elements are arrayed in a line in the first direction (i.e., X direction). Such a structure can shorten the size of the light emitting device 2000 in the second direction (i.e., Y direction), and thus can decrease the thickness of the light emitting device 2000.

As shown in FIG. 10, the first light emitting element 20A and the second light emitting element 20B may be covered with one light-transmissive member 30. Alternatively, as in a light emitting device 2000A shown in FIG. 12A and FIG. 12B, the first light emitting element 20A and the second light emitting element 20B may be covered with different light-transmissive members 30 from each other. In the case where the first light emitting element 20A and the second light emitting element 20B are covered with one light-transmissive member 30, the light-transmissive member 30 becomes larger, which can improve the light extraction efficiency of the light emitting device. In the case where the first light emitting element 20A and the second light emitting element 20B are covered with different light-transmissive members 30 from each other, the first reflective member 40 can exist between such two light-transmissive members 30. With such a structure, the light emitting device has a highly clear border between a light emitting region and a non-light emitting region.

Figure 12A:
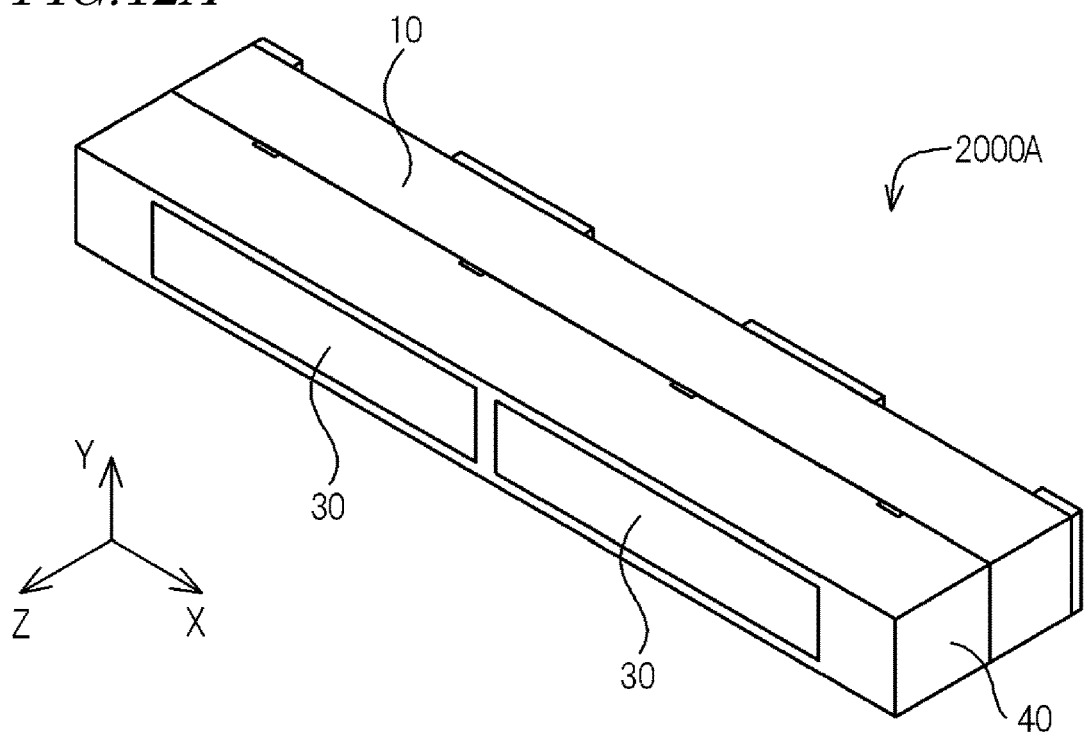
FIG. 12A is a schematic perspective view of a light emitting device according to a modification of embodiment 2.
Figure 12B:
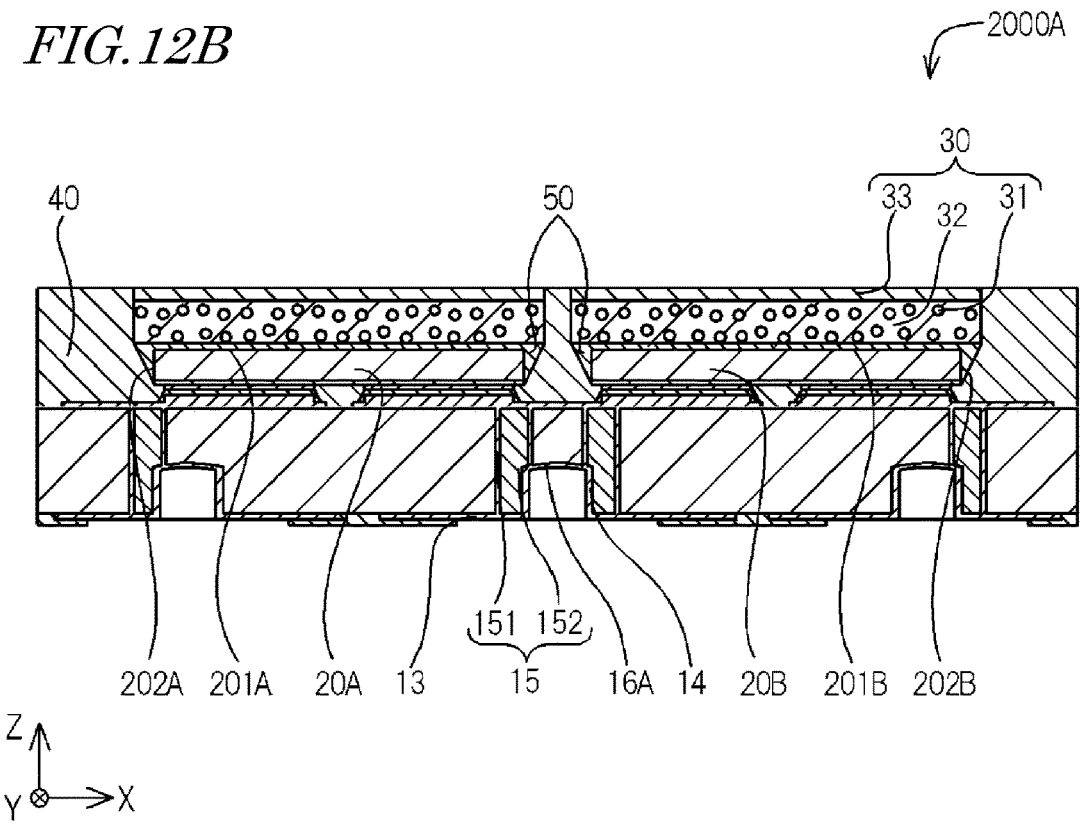
FIG. 12B is a schematic cross-sectional view of the light emitting device according to the modification of embodiment 2.
Figure 12C:
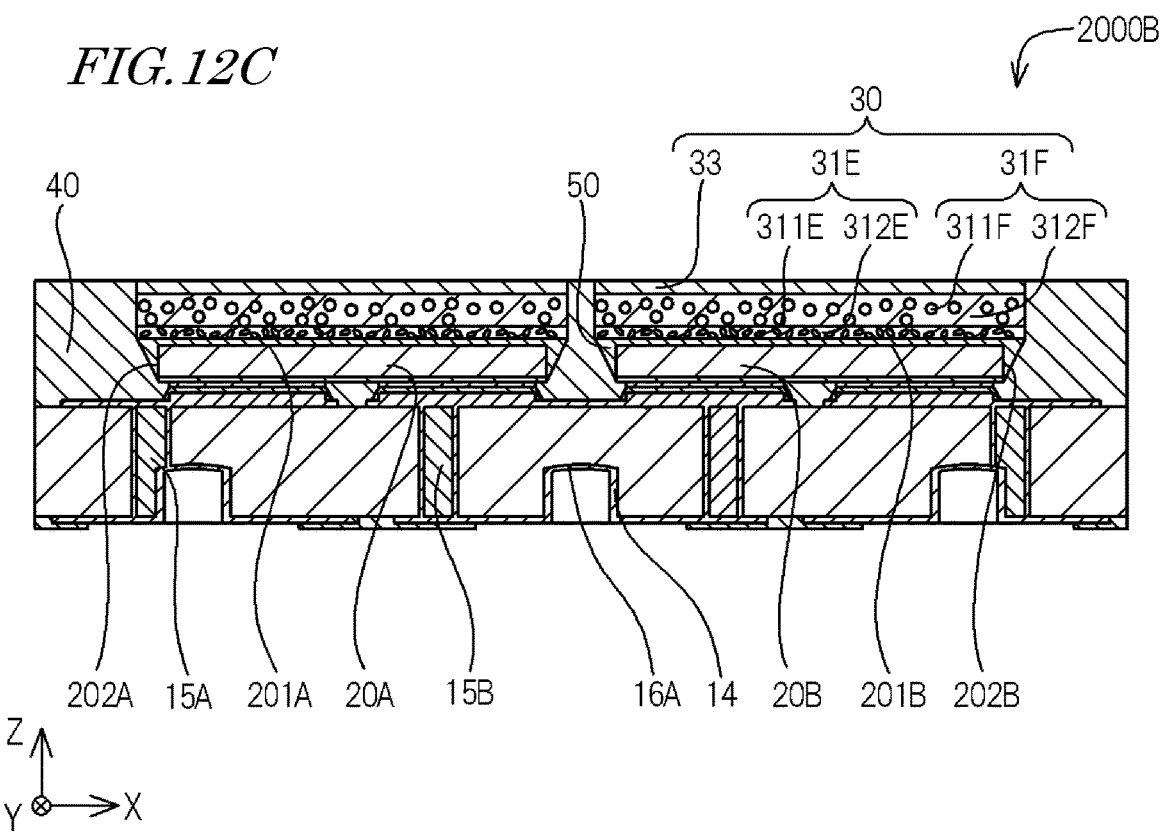
FIG. 12C is a schematic cross-sectional view of a light emitting device according to another modification of embodiment 2.

As in a light emitting device 2000B shown in FIG. 12C, the light-transmissive member 30 disposed on each of the light emitting elements may include a first wavelength conversion layer 31E facing the light extraction surface of the light emitting element and a second wavelength conversion layer 31F provided on the first wavelength conversion layer 31E. The first wavelength conversion layer 31E contains a matrix 312E and first wavelength conversion particles 311E. The second wavelength conversion layer 31F contains a matrix 312F and second wavelength conversion particles 311F. It is preferable that light from the first wavelength conversion particles 311E excited by the light emitting element has an emission peak wavelength shorter than an emission peak wavelength of light from the second wavelength conversion particles 311F excited by the light emitting element. With the structure in which the emission peak wavelength of the light from the first wavelength conversion particles 311E excited by the light emitting element is shorter than the emission peak wavelength of the light from the second wavelength conversion particles 311F excited by the light emitting element, the light from the first wavelength conversion particles 311E excited by the light emitting element can excite the second wavelength conversion particles 311F. This can increase the amount of the light excited by the second wavelength conversion particles 311F. Because the second wavelength conversion layer 31F is located on the first wavelength conversion layer 31E, the light from the first wavelength conversion particles 311E excited by the light emitting element easily exits toward the second wavelength conversion particles 311F.

It is preferable that the emission peak wavelength of the light from the first wavelength conversion particles 311E excited by the light emitting element is in the range of from 500 nm to 570 nm. It is preferable that the emission peak wavelength of the light from the second wavelength conversion particles 311F excited by the light emitting element is in the range of from 610 nm to 750 nm. With such an arrangement, the light emitting device 2000B can have a high color rendering properties. The first wavelength conversion particles 311E may be formed of, for example, a β-SiAlON-based phosphor, and the second wavelength conversion particles 311F may be formed of, for example, a phosphor of manganese-activated potassium fluorosilicate. In the case where a phosphor of manganese-activated potassium fluorosilicate is used for the second wavelength conversion particles 311F, it is especially preferable that the light-transmissive member 30 includes the first wavelength conversion layer 31E and the second wavelength conversion layer 31F. The second wavelength conversion particles 311F, which are formed of a manganese-activated fluoride phosphor, easily causes brightness saturation. However, with the structure in which the first wavelength conversion layer 31E is located between the second wavelength conversion layer 31F and the light emitting element, the light from the light emitting element is less likely to be excessively directed toward the second wavelength conversion particles 311F. This can mitigate degradation of the second wavelength conversion particles 311F. In the case where the first wavelength conversion particles 311E and the second wavelength conversion particles 311F are contained in the same wavelength conversion layer, it is preferable that the second wavelength conversion particles 311F are dispersed in the entirety of the wavelength conversion layer whereas the first wavelength conversion particles 311E are locally present in the vicinity of the light extraction surface of the light emitting element. For example, the first wavelength conversion particles 311E and the second wavelength conversion particles 311F may be located in a mixed state in the vicinity of the light extraction surface of the light emitting element, and substantially the only second wavelength conversion particles 311F may be located in the vicinity of the surface of the wavelength conversion layer opposite to the light extraction surface of the light emitting element. In the case where the second wavelength conversion particles 311F are dispersed in the entirety of the wavelength conversion layer whereas the first wavelength conversion particles 311E are locally present in the vicinity of the light extraction surface of the light emitting element, most of the first wavelength conversion particles 311E are located closer to the light extraction surface of the light emitting element than the second wavelength conversion particles 311F. Therefore, the light from the first wavelength conversion particles 311E excited by the light emitting element tends to excite the second wavelength conversion particles 311F. This can increase the amount of the light exited by the second wavelength conversion particles 311F. In the case where a phosphor of manganese-activated potassium fluorosilicate is used for the second wavelength conversion particles 311F, the first wavelength conversion particles 311E can mitigate that the light from the light emitting element excessively irradiates the second wavelength conversion particles 311F. This can mitigate degradation of manganese-activated fluoride phosphor as the second wavelength conversion particles 311F.

The light-transmissive member 30 may include one kind of wavelength conversion particles emitting green light or a plurality kinds of wavelength conversion particles emitting green light. The light-transmissive member 30 may include one kind of wavelength conversion particles emitting red light or a plurality kinds of wavelength conversion particles emitting red light. For example, the light-transmissive member 30 may contain a CASN-based phosphor and a phosphor of manganese-activated potassium fluorosilicate (e.g., $K_2SiF_6$:Mn) as the wavelength conversion particles which emit light having an emission peak wavelength in the range of from 610 nm to 750 nm when excited by the light emitting element. In general, the CASN-based phosphor has an afterglow time shorter than that of the phosphor of manganese-activated potassium fluorosilicate. The "afterglow time" is a time period required until the light emission of wavelength conversion particles is stopped after irradiation of the wavelength conversion particles with excitation light is stopped. In the case where the light-transmissive member 30 contains the CASN-based phosphor and the phosphor of manganese-activated potassium fluorosilicate, the afterglow time of the light-transmissive member 30 can be shorter than in the case where the light-transmissive member 30 contains substantially the only phosphor of manganese-activated potassium fluorosilicate. In general, manganese-activated potassium fluorosilicate has an emission peak of a narrower half width than that of the CASN-based phosphor. Therefore, the phosphor of manganese-activated potassium fluorosilicate has a higher color purity than the CASN-based phosphor, thereby realizing a higher color reproducibility than the CASN-based phosphor. In the case where the light-transmissive member 30 contains the CASN-based phosphor and the phosphor of manganese-activated potassium fluorosilicate, the color reproducibility of the light emitting device is higher than in the case where the light-transmissive member 30 contains only the CASN-based phosphor.

The weight of the phosphor of manganese-activated potassium fluorosilicate contained in the light-transmissive member 30 is preferably, for example, in the range of from 0.5 times to 6 times the weight of the CASN-based phosphor, more preferably in the range of form 1 time to 5 times, the weight of the CASN-based phosphor, and still more preferably in the range of from 2 times to 4 times the weight of the CASN-based phosphor. A larger weight of the phosphor of manganese-activated potassium fluorosilicate can improve the color reproducibility of the light emitting device. A larger weight of the CASN-based phosphor can shorten the afterglow time.

It is preferred that the wavelength conversion particles formed of the phosphor of manganese-activated potassium fluorosilicate have an average particle size in the range of from 5 Jim to 30 μm. It is preferred that the wavelength conversion particles formed of the CASN-based phosphor have an average particle size in the range of from 5 μm to 30 μm. A plurality of kinds of the wavelength conversion particles may be contained in the light-transmissive member 30 at substantially even concentrations while having a shorter particle size on average. Accordingly, light from the light emitting element can be easily diffused, and thus, the color non-uniformity of the light emitting device can be mitigated. The plurality of kinds of the wavelength conversion particles may be contained in the light-transmissive member 30 at substantially even concentrations while having a larger particle size on average. This can make it easy to extract the light from the light emitting element, and thus can improve the light extraction efficiency of the light emitting device.

The CASN-based phosphor and the phosphor of manganese-activated potassium fluorosilicate may be contained in the same wavelength conversion layer of the light-transmissive member 30, or in the case where the light-transmissive member 30 includes a plurality of wavelength conversion layers, may be contained in different wavelength conversion layers. In the case where the phosphor of manganese-activated potassium fluorosilicate and the CASN-based phosphor are contained in different wavelength conversion layers from each other, it is preferable that the wavelength conversion particles formed of whichever material having a shorter emission peak wavelength is located closer to the light emitting element. With such a structure, light from the wavelength conversion particles having a shorter emission peak wavelength can excite the wavelength conversion particles emitting light having a longer emission peak wavelength. In the case where, for example, the phosphor of manganese-activated potassium fluorosilicate has an emission peak wavelength of about 631 nm and the CASN-based phosphor has an emission peak wavelength of about 650 nm, it is preferable that the wavelength conversion particles formed of the phosphor of manganese-activated potassium fluorosilicate are located closer to the light emitting element.

The light-transmissive member 30 may contain an SCASN-based phosphor and a phosphor of manganese-activated potassium. Even in the case where the light-transmissive member 30 contains the SCASN-based phosphor, the afterglow time can be shortened. The light-transmissive member 30 may contain a CASN-based phosphor, a phosphor of manganese-activated potassium fluorosilicate, and a β-SiAlON-based phosphor. With such a structure, the color reproducibility of the light emitting device can be improved.

Figure 12D:
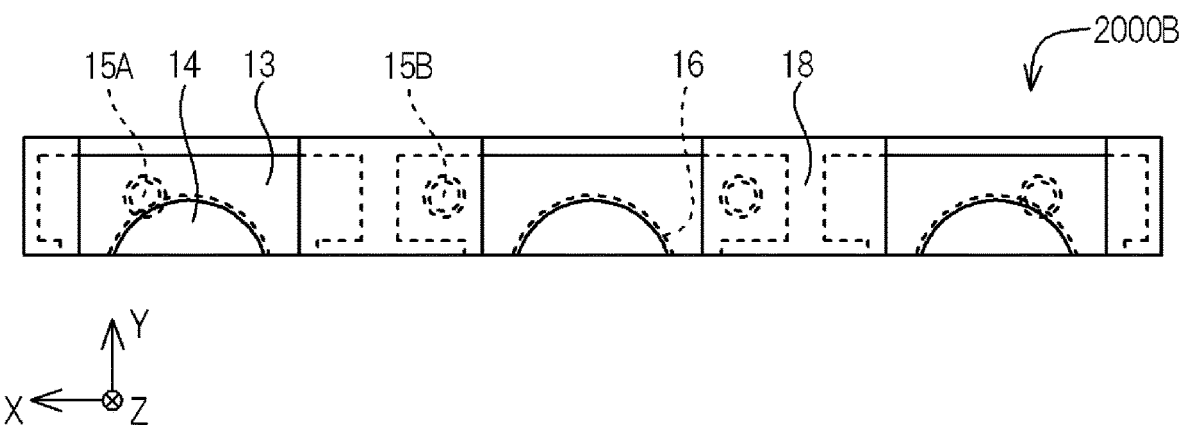
FIG. 12D is a schematic rear view of the light emitting device according to said another modification of embodiment 2.

As shown in FIG. 12C, the light emitting device 2000B may include at least one via 15A connected with the first wiring portion 12, the second wiring portion 13 and the third wiring portion 14, and also at least one via 15B connected with the first wiring portion 12 and the second wiring portion 13 but apart from the third wiring portion 14. As shown in FIG. 12D, as seen in a rear view, the via 15A overlaps the second wiring portion 13 and the third wiring portion 14, whereas the via 15B overlaps the second wiring portion 13 but does not overlap the third wiring portion 14.

Figure 12G:
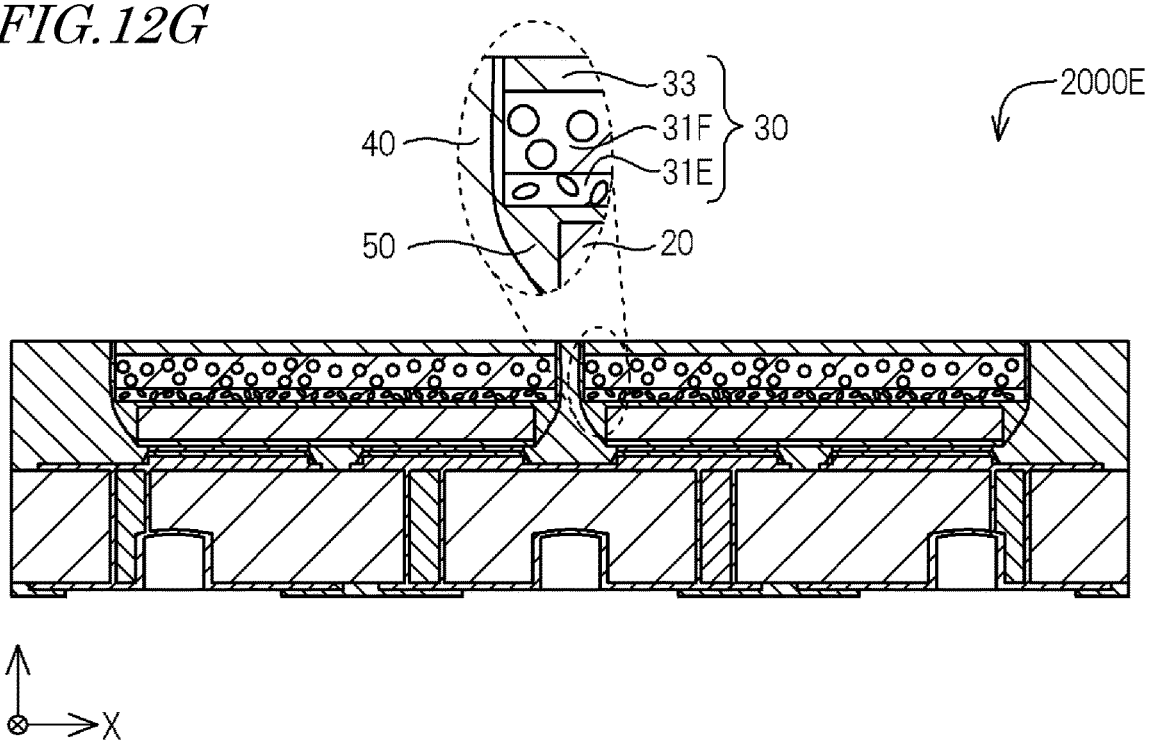
FIG. 12G is yet another schematic cross-sectional view of a light emitting device according to a modification of embodiment 2.
Figure 12H:
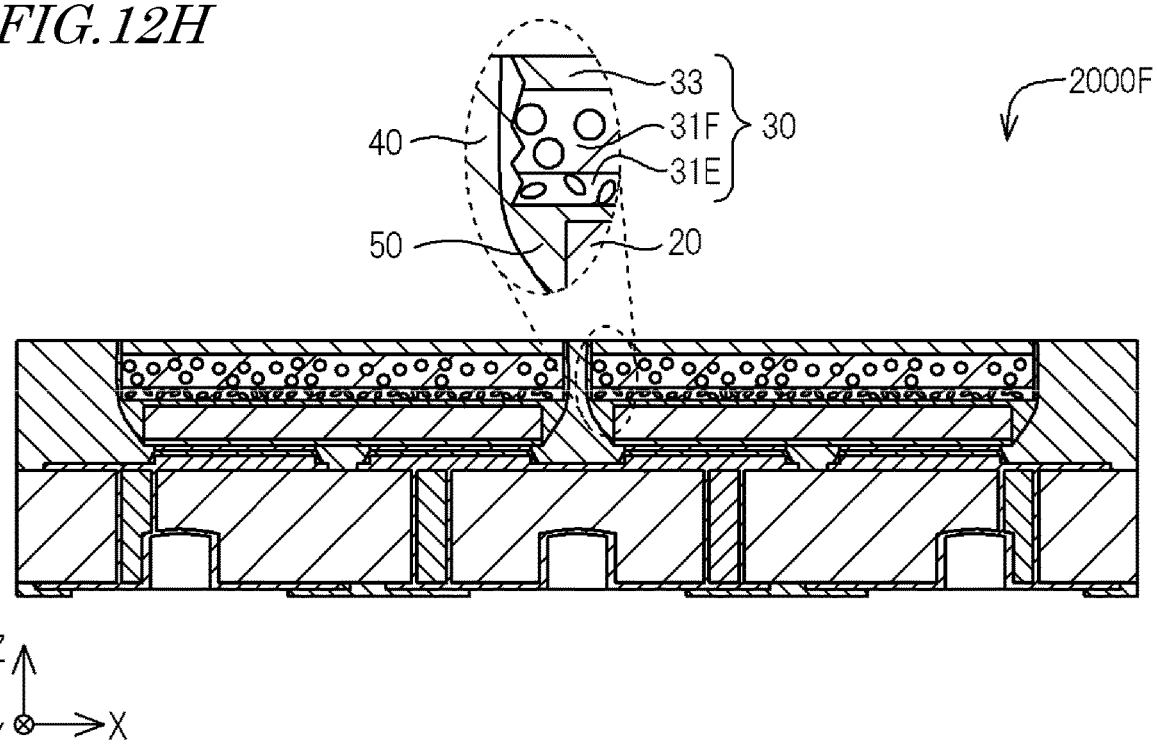
FIG. 12H is yet another schematic cross-sectional view of a light emitting device according to a modification of embodiment 2.

As shown in FIG. 12C, the light guide member 50 does not need to cover the lateral surfaces of the light-transmissive member 30. Alternatively, the light guide member 50 may cover the lateral surfaces of the light-transmissive member 30. The light-transmissive member 30 may include the first wavelength conversion layer 31E facing the light extraction surface of the light emitting element, the second wavelength conversion layer 31F located on the first wavelength conversion layer 31E and the layer 33, which is provided on the second wavelength conversion layer 31F and contains substantially no wavelength conversion particle. In this case, as in a light emitting device 2000C shown in FIG. 12E, lateral surfaces of the first wavelength conversion layer 31E may be covered with the light guide member 50, whereas lateral surfaces of the second wavelength conversion layer 31F and lateral surfaces of the layer 33 including substantially no wavelength conversion particle may be exposed from the light guide member 50. As in a light emitting device 2000D shown in FIG. 12F, the lateral surfaces of the first wavelength conversion layer 31E and the lateral surfaces of the second wavelength conversion layer 31F may be covered with the light guide member 50, whereas the lateral surfaces of the layer 33 containing substantially no wavelength conversion particle (also referred to as a "substantially wavelength conversion particle free layer") may be exposed from the light guide member 50. Alternatively, as in a light emitting device 2000E shown in FIG. 12G, the lateral surfaces of the first wavelength conversion layer 31E, the lateral surfaces of the second wavelength conversion layer 31F and the lateral surfaces of the layer 33 containing substantially no wavelength conversion particle may be covered with the light guide member 50. In the case where as shown in FIG. 12G, the lateral surface of the first wavelength conversion layer 31E, the lateral surface of the second wavelength conversion layer 31F and the lateral surface of the layer 33 substantially including no wavelength conversion particle are covered with the light guide member 50, the light guide member 50 may be exposed from the first reflective member 40 at a light emission surface side of the light emitting device 2000E. With the structure in which at least at least one part of the lateral surfaces of the light-transmissive member 30 is covered with the light guide member 50, the light extraction efficiency of the light emitting device can be improved. In the case where as in a light emitting device 2000F shown in FIG. 12H, the light-transmissive member 30 has at least one concaved and convexed portion on the lateral surfaces, the at least one concaved and convexed portion of the lateral surfaces of the light-transmissive member 30 may be covered with the light-transmissive member 50. With such a structure, the light extraction efficiency of the light emitting device can be improved.

Figure 12I:
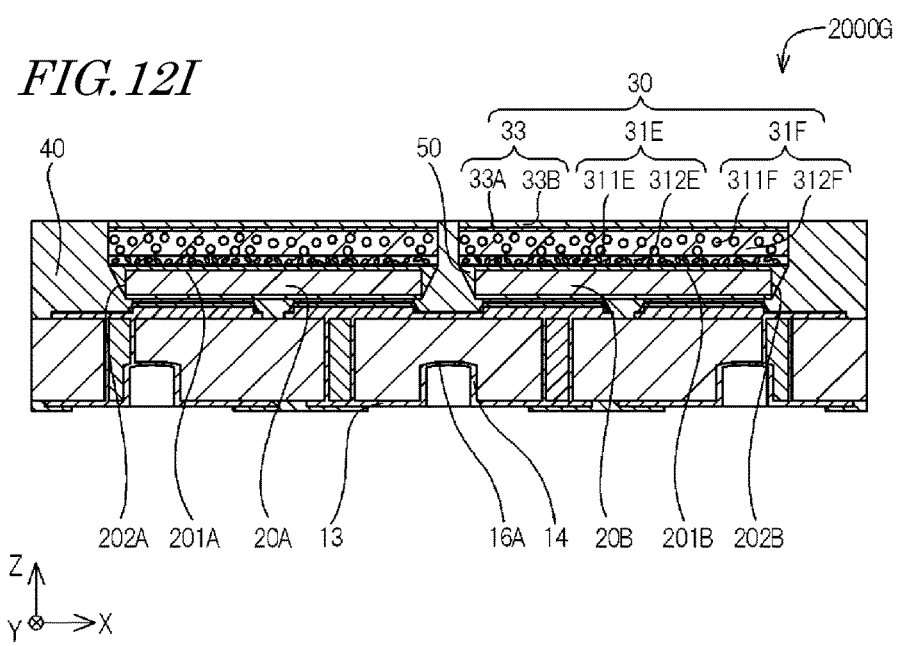
FIG. 12I is yet another schematic cross-sectional view of a light emitting device according to a modification of embodiment 2.

It is preferable that as in a light emitting device 2000G shown in FIG. 12I, the substantially wavelength conversion particle free layer 33 includes a layer 33A containing reflective particles (also referred to as a "reflective particle containing layer), and includes a layer 33B containing substantially no reflective particle (also referred to as a "substantially reflective particle free layer"). With the structure in which the reflective particle containing layer 33A is located on or above the first wavelength conversion layer 31E and/or the second wavelength conversion layer 31F, the light from the light emitting element is diffused in the light-transmissive member 30 by the light reflective particle containing layer 33A. This can increase the amount of the light from the first wavelength conversion layer particles 311E and/or the second wavelength conversion particles 311F excited by the light from the light emitting element. With the structure in which the substantially reflective particle free layer 33B is located on the reflective particle containing layer 33A, the substantially reflective particle free layer 33B can serve as a protective layer for the reflective particle containing layer 33A. Such a structure is preferable in the case where the top surface of the light-transmissive member 30 is ground in order to, for example, decrease the thickness of the light emitting device. A reason for this is that with such a structure, only the substantially reflective particle free layer 33B is ground. Accordingly, the layer reflective particle containing 33A can be substantially avoided from being ground, the amount of the reflective particles contained in the light-transmissive member 30 is less likely to vary in region by region. In the case where the substantially wavelength conversion particle free layer 33 includes only the reflective particle containing layer 33A, it is preferable that the reflective particles are locally present close to the light extraction surface of the light emitting element. With such a structure, a matrix of the substantially wavelength conversion particle free layer 33 can serve as a protective layer. The reflective particles may be formed of titanium oxide, zirconium oxide, aluminum oxide, silicon oxide or the like. Titanium oxide, which has a high refractive index, is especially preferable for the reflective particles. A content of the reflective particles in the substantially wavelength conversion particle free layer 33 can be appropriately selected. From the point of view of the light reflectance, the viscosity in a liquid state and the like, it is preferred that the content of the reflective particles in the layer 33 is, for example, in the range of from 0.05 wt. % to 0.1 wt. %.

Figure 12J:
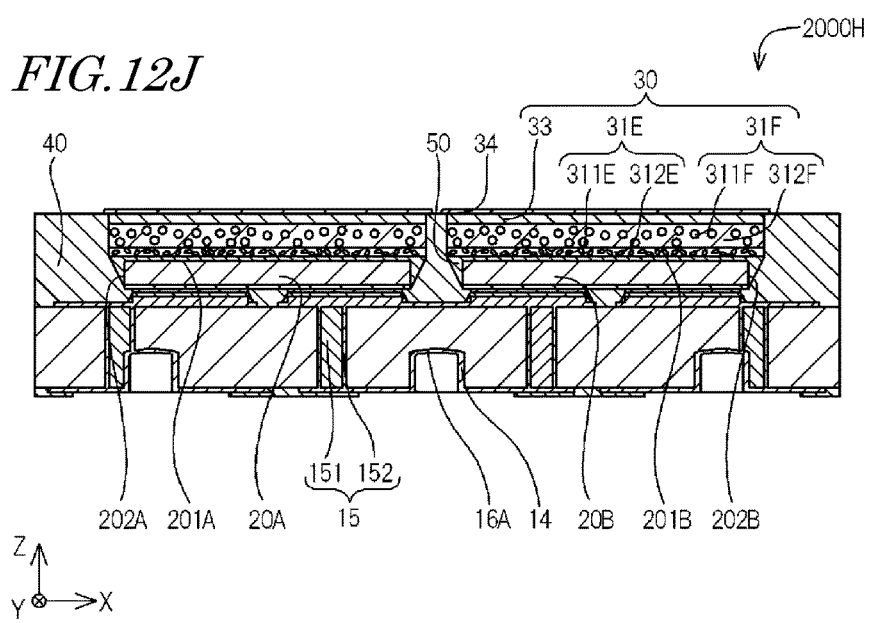
FIG. 12J is a schematic cross-sectional view of a light emitting device according to yet another modification of embodiment 2.

In the case where as in a light emitting device 2000H shown in FIG. 12J, the light-transmissive member 30 contains the wavelength conversion particles, the light emitting device 2000H may include a cover film 34 covering the top surface of the light-transmissive member 30. The cover film 34 may be an aggregate of covering particles, which are nanoparticles. The cover film 34 may be formed of the covering particles, or may include the covering particles and a matrix formed of a resin material. With a structure in which the cover film 34 has a refractive index different from that of an outermost surface area of the matrix in the light-transmissive member 30, the chromaticity of the light emitted by the light emitting device can be corrected. The "outermost surface area of the matrix in the light-transmissive member 30" refers to the matrix configuring an outermost layer at a surface of the light-transmissive member 30 opposite to the light extraction surface of the light emitting element. In the case where, for example, the refractive index of the cover film 34 is higher than the refractive index of the outermost surface are of the matrix in the light-transmissive member 30, the amount of a reflected light at an interface between the cover film 34 and the air is larger than the amount of a reflected light at an interface between the air and the part of the matrix of the light-transmissive member 30 that is located at the outermost surface. This can increase the amount of the reflected light returning into the light-transmissive member 30, and thus the wavelength conversion particles can be excited more easily. Therefore, the chromaticity of the light emitted from the light emitting device can be corrected toward the longer wavelength side. By contrast, in the case where the refractive index of the cover film 34 is lower than the refractive index of the outermost surface area of the matrix in the light-transmissive member 30, the amount of the reflected light at the interface between the cover film 34 and the air is smaller than the amount of the reflected light at the interface between the air and the outermost surface area of the light-transmissive member 30. This can decrease the amount of the reflected light returning into the light-transmissive member 30, and thus the wavelength conversion particles is less likely to be excited. Therefore, the chromaticity of the light emitted by the light emitting device can be corrected toward the shorter wavelength side. In the case where, for example, the outermost surface area of the matrix in the light-transmissive member 30 is formed of a phenyl-based silicone resin, and the chromaticity of the light emitted from the light emitting device is corrected toward the longer wavelength side, the covering particles may be formed of titanium oxide, aluminum oxide or the like. In the case where the outermost surface area of the matrix in the light-transmissive member 30 is formed of a phenyl-based silicone resin and the chromaticity of the light emitted by the light emitting device is corrected toward the shorter wavelength side, the covering particles may be formed of silicon oxide or the like. In the case where the light emitting device includes a plurality of the light-transmissive members, the top surface of one of the light-transmissive members may be covered with the cover film 34, whereas the top surface of another of the light-transmissive members does not need to be covered with the cover film 34. Whether or not to form the cover film 34 covering the top surface of the light-transmissive member 30 may be appropriately selected depending on the degree of correction of the chromaticity of the light emitted from the light emitting device. In the case where the light emitting device includes the plurality of light-transmissive members, the top surface of one of the light-transmissive members may be covered with a cover film having a refractive index higher than the refractive index of the outermost surface area of the matrix in the light-transmissive members, whereas the top surface of another of the light-transmissive members may be covered with a cover film having a refractive index lower than the refractive index of the outermost surface area of the matrix in the light-transmissive member. The material of the cover film 34 covering the light-transmissive member 30 may be appropriately selected depending on the degree of correction of the chromaticity of the light emitted from the light emitting device. The cover film 34 may be formed by a known method such as potting with a dispenser, ink-jetting, spraying or the like.

Figure 12K:
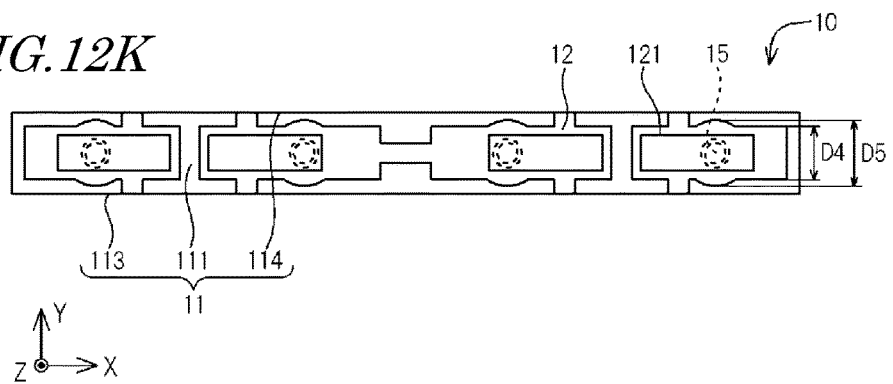
FIG. 12K is a schematic front view of a substrate according to embodiment 2.
Figure 13A:
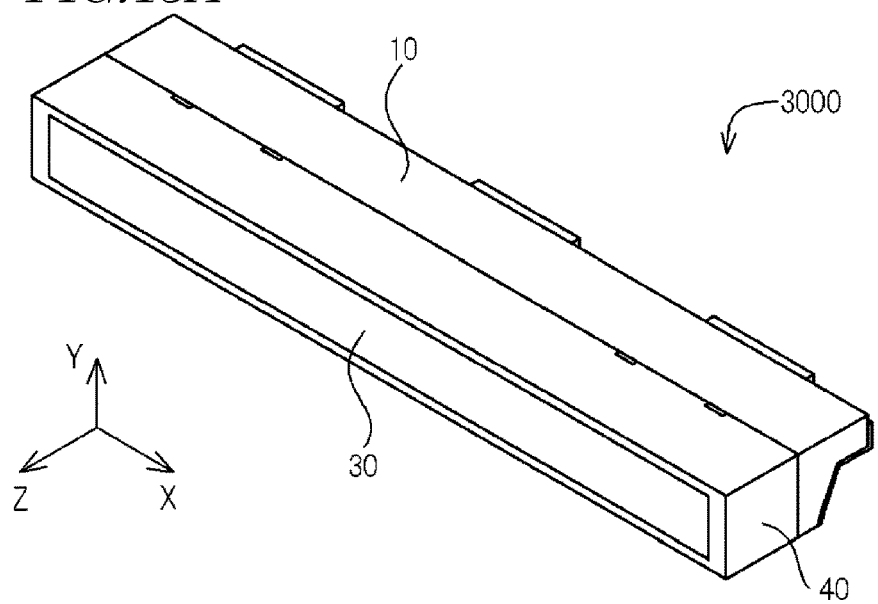
FIG. 13A is a schematic perspective view of a light emitting device according to embodiment 3.
Figure 13B:
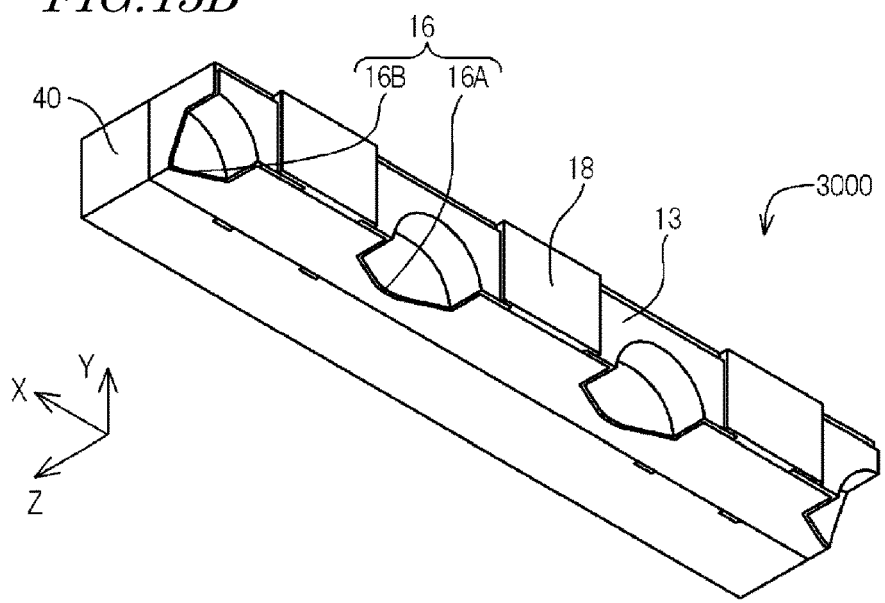
FIG. 13B is a schematic perspective view of the light emitting device according to embodiment 3.
Figure 13C:
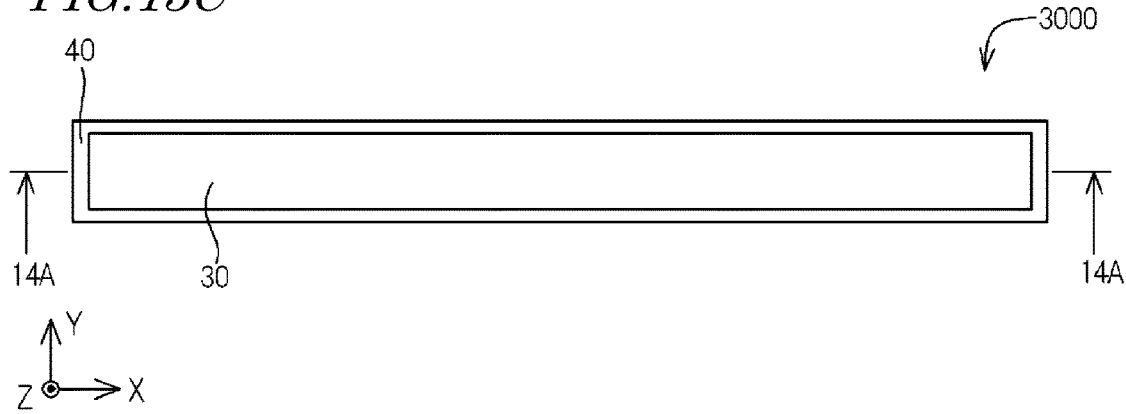
FIG. 13C is a schematic front view of the light emitting device according to embodiment 3.

As in the substrate 10 shown in FIG. 12K, it is preferable that the first wiring portions 12 include at least one narrow portion having a short length in the Y direction and at least one wide portion having a long length in the Y direction as seen in a front view. Length D4 of the narrow portion in the Y direction is shorter than length D5 of the wide portion in the Y direction. The narrow portion is located at a position which is apart from the center of the via 15 in the X direction as seen in a front view, and at which the electrodes of the light emitting element are located in the X direction. The wide portion is located at the center of the via 15 as seen in a front view. With the structure in which at least one of the first wiring portions 12 includes the narrow portion, the area size in which the conductive bonding member 60, electrically connecting the electrodes of the light emitting element and the first wiring portions 12 to each other, expands in a wet state is decreased. This can facilitate control of the shape of the conductive bonding member 60. The first wiring portions 12 may each have a shape of which at least one corner is rounded.

As shown in FIG. 10, the light guide member 50 may continuously cover a light extraction surface 201A of the first light emitting element 20A, at least one lateral surface 202A of the first light emitting element 20A, a light extraction surface 201B of the second light emitting element 20B, and at least one lateral surface 202B of the second light emitting element 20B. With such a structure, the light from the first light emitting element 20A and/or the second light emitting element 20B can be extracted also at a position between the light extraction surface 201A of the first light emitting element 20A and the light extraction surface 201B of the second light emitting element 20B. This can mitigate a luminance non-uniformity of the light emitting device. In the case where the emission peak wavelength of the first light emitting element 20A and the emission peak wavelength of the second light emitting element 20B are different from each other, the light from the first light emitting element 20A and the light from the second light emitting element 20B can be mixed together in the light guide member 50. This can mitigate the color non-uniformity of the light emitting device.

Figure 9A:
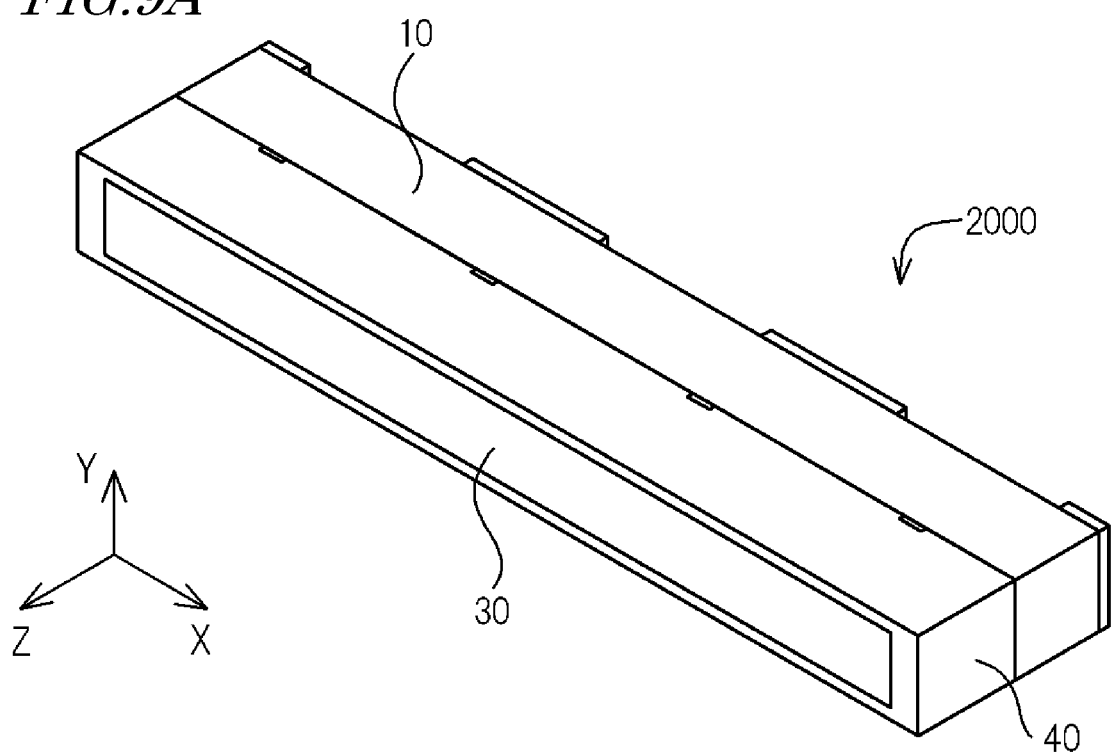
FIG. 9A is a schematic perspective view of a light emitting device according to embodiment 2.
Figure 9B:
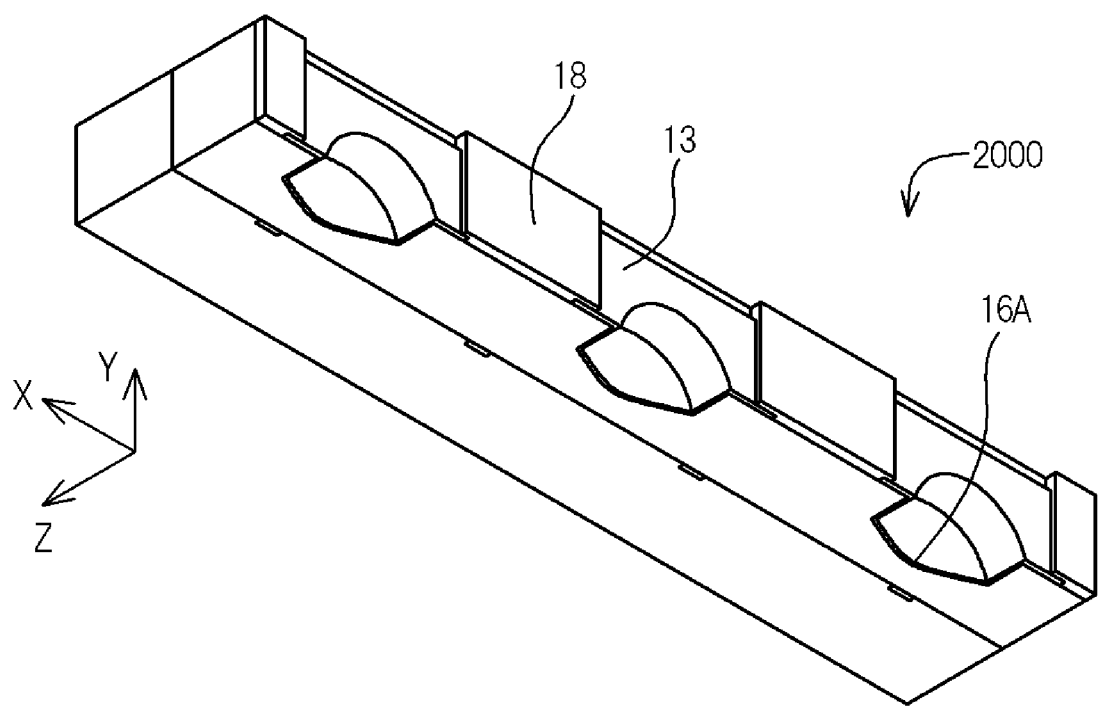
FIG. 9B is a schematic perspective view of the light emitting device according to embodiment 2.
Figure 9C:
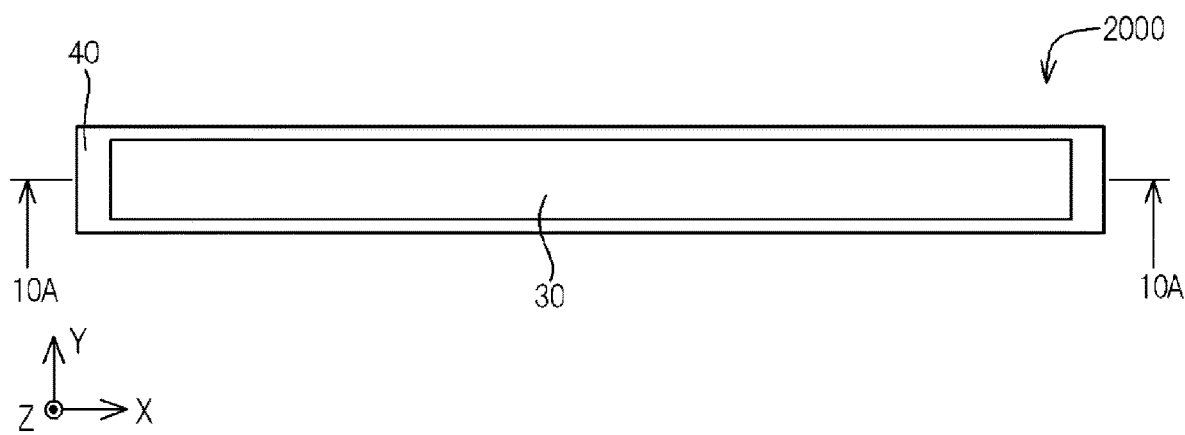
FIG. 9C is a schematic front view of the light emitting device according to embodiment 2.
Figure 9D:
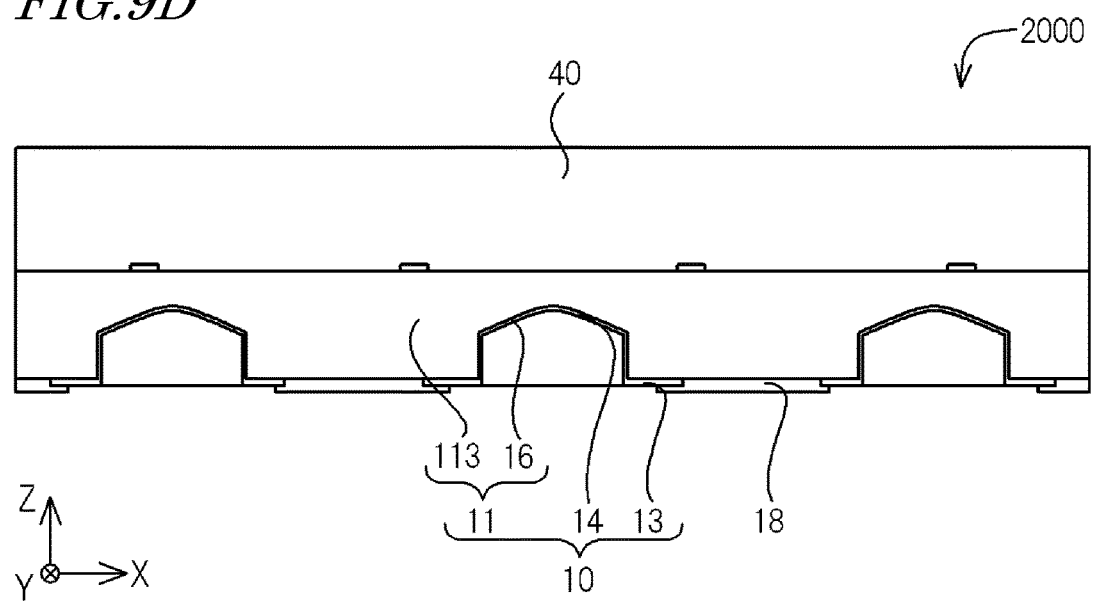
FIG. 9D is a schematic bottom view of the light emitting device according to embodiment 2.

The light emitting device 2000 may include the insulating film 18 covering a part of the second wiring portion 13 (see, e.g., FIG. 9B). The provision of the insulating film 18 can ensure that a rear surface of the light emitting device is insulated and reduce a risk of short-circuit of the light emitting device. The insulating film 18 can also reduce a risk that the second wiring portion from being delaminated from the base member.

Embodiment 3

A light emitting devices in embodiment 3 according to the present disclosure shown in FIG. 13A through FIG. 18B are different from the light emitting devices in embodiment 2 in the number of the light emitting elements placed on the substrate 10, the number of the recessed portions 16 and the vias 15 included in the base member 11, the shape of the base member 11, the shape of the recessed portions 16, the structure of the light-transmissive member 30, and whether a second reflective member 41 and a third reflective member 42 are included or not.

Figure 14A:
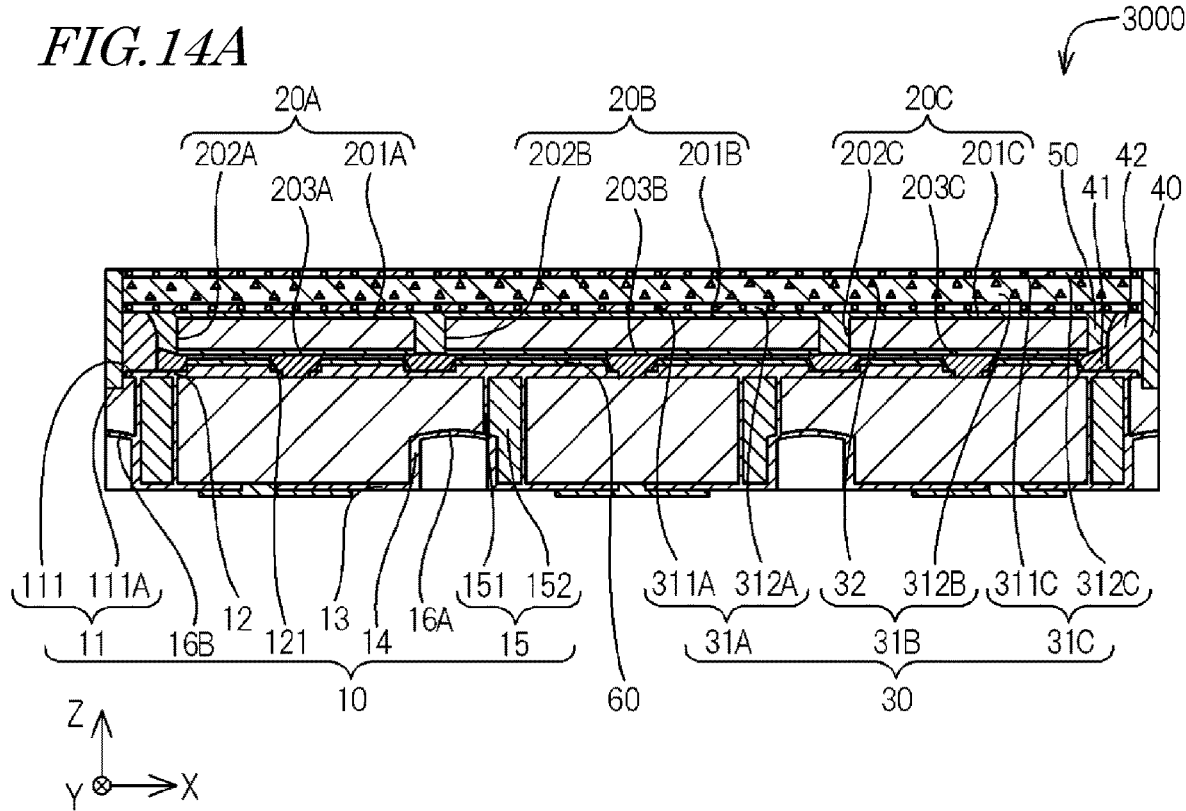
FIG. 14A is a schematic cross-sectional view of the light emitting device taken along line 14A-14A in FIG. 13C.
Figure 14B:
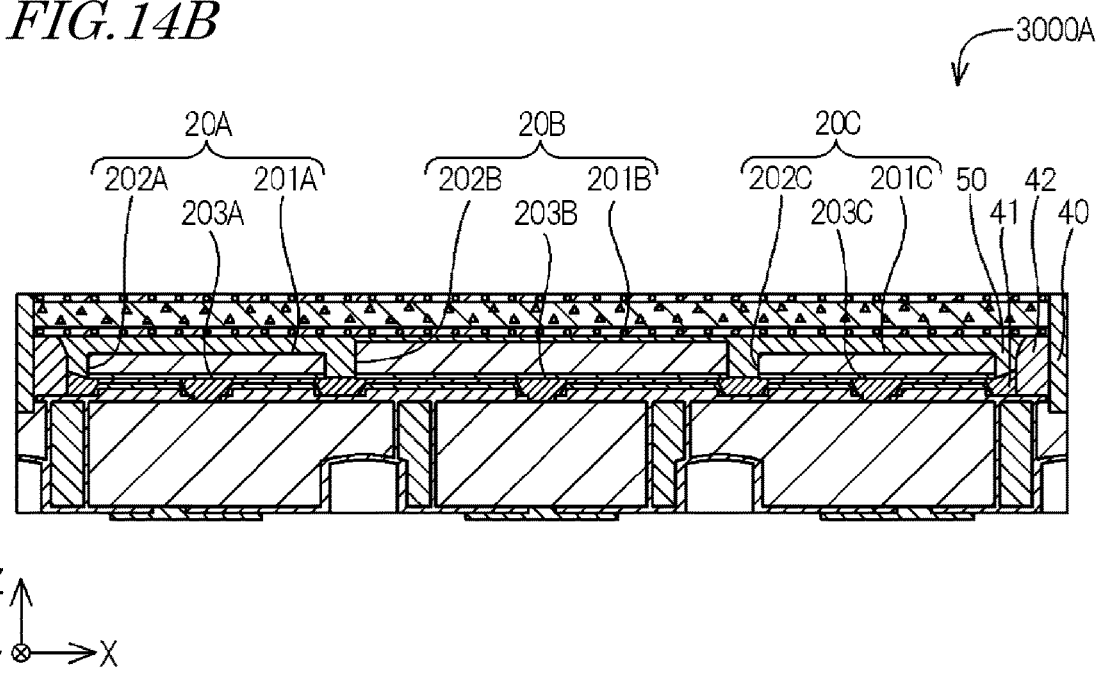
FIG. 14B is a schematic cross-sectional view of a light emitting device according to a modification of embodiment 3.
Figure 14C:
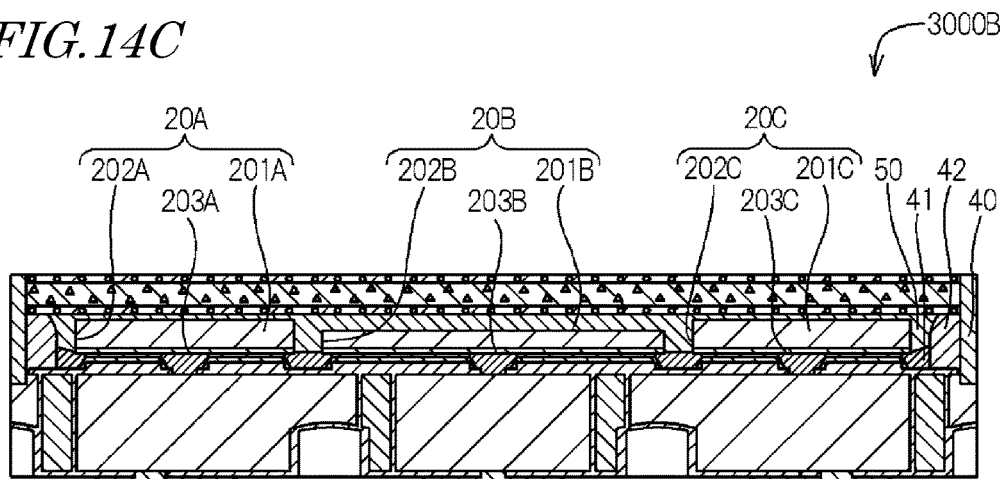
FIG. 14C is a schematic cross-sectional view of a light emitting device according to a modification of embodiment 3.

As shown in FIG. 14A, the vias 15 are each in contact with the first wiring portion 12, the second wiring portion 13 and the third wiring portion 14. Such a structure can improve the level of heat dissipation of the light emitting device 3000. The number of the recessed portions 16 and the vias 15 formed in the base member 11 may be appropriately changed depending on, for example, the size of the substrate 10.

As shown in FIG. 14A, the base member 11 may have at least one depressed portion 111A in the front surface 111, in which the first reflective member is to be supplied. With the depressed portion 111A formed in the base member 11, the contact area size of the first reflective member 40 and the base member 11 is increased. This can increase the joining strength between the first reflective member 40 and the base member 11. It is preferable that two of the depressed portions 111A are respectively located at both of two ends of the front surface 111 in the longer direction (i.e., X direction). Such a structure can increase the joining strength between the first reflective member 40 and the base member 11 at both of the two ends of the base member 11. Therefore, the first reflective member 40 is less likely to be separated from the base member 11.

Figure 15:
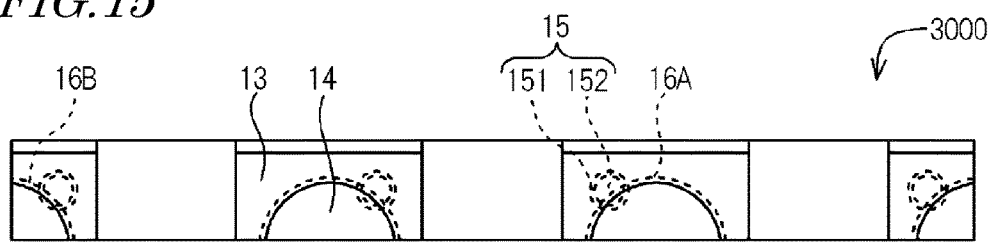
FIG. 15 is a schematic rear view of the light emitting device according to embodiment 3.
Figure 16:
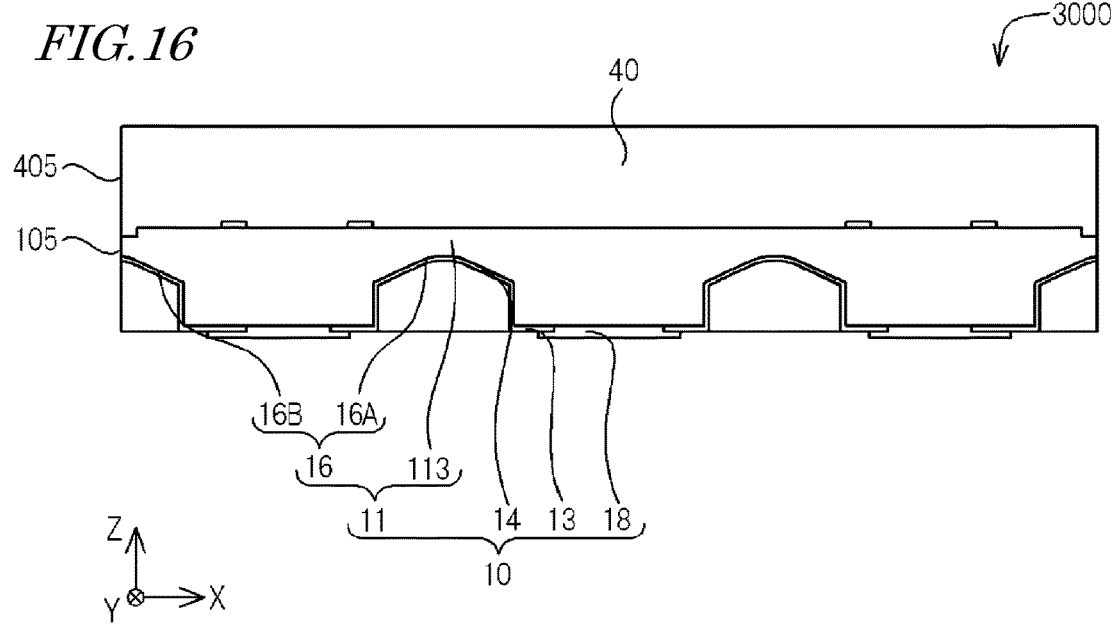
FIG. 16 is a schematic bottom view of the light emitting device according to embodiment 3.

As shown in FIG. 15 and FIG. 16, the substrate 10 may have at least one central recessed portion 16A opened on the rear surface 112 and the bottom surface 113 and apart from the lateral surface 105 of the base member 11, and at least one end recessed portion 16B opened on the rear surface 112, the bottom surface 113 and at least one of the lateral surfaces 105 of the base member 11. The lateral surfaces 105 of the base member 11 are located between the front surface 111 and the rear surface 112 of the base member 11. With the structure in which the substrate 10 has the end recessed portion 16B, the joining strength between the light emitting device 3000 and the mounting substrate can be increased at both of two ends of the light emitting device 3000. In the case where the substrate 10 includes a plurality of the end recessed portions 16B, it is preferable that the end recessed portions 16B are located at both of two ends of the base member 11 as seen in a rear view. Such a structure can increase the joining strength between the light emitting device 3000 and the mounting substrate. The substrate 10 may include either one of the central recessed portion 16A and the end recessed portion 16B. In this specification, the "recessed portion" refers to the central recessed portion 16A and/or the end recessed portion 16B. As shown in FIG. 15, the substrate 10 may have the plurality of vias 15, and the plurality of vias 15 may include a via 15 overlapping the central recessed portion 16A and/or a via 15 overlapping the end recessed portion 16B as seen in a rear view.

Figure 17A:
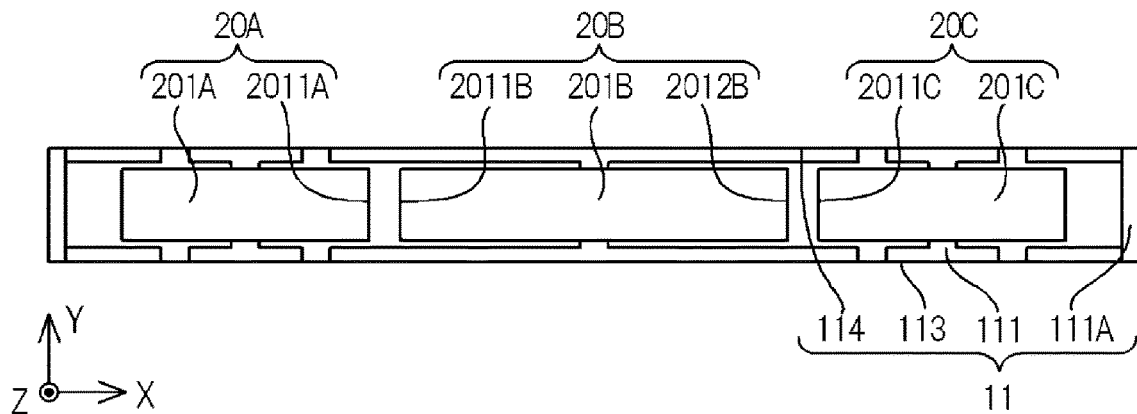
FIG. 17A is a schematic front view of a substrate, a first light emitting element, a second light emitting element and a third light emitting element according to embodiment 3.

As shown in FIG. 14A, the light emitting device 3000 may include the first light emitting element 20A, the second light emitting element 20B and a third light emitting element 20C. The light emitting device may include four or more light emitting elements. In this specification, the "light emitting element" refers to the first light emitting element 20A, the second light emitting element 20B and/or the third light emitting element 20C. As shown in FIG. 17A, it is preferable that the first light emitting element 20A, the second light emitting element 20B and the third light emitting element 20C are arrayed in a line in the longer direction (i.e., X direction) as seen in a front view. Such a structure can decrease the thickness of the light emitting device 3000 in the Y direction. In the case where the light extraction surface 201A of the first light emitting element 20A and the light extraction surface 201B of the second light emitting element 20B are rectangular in shape, it is preferable that a shorter side 2011A of the light extraction surface 201A of the first light emitting element 20A and one shorter side 2011B of the light extraction surface 201B of the second light emitting element 20B face each other. In the case where the light extraction surface 201B of the second light emitting element 20B and a light extraction surface 201C of the third light emitting element 20C are rectangular in shape, it is preferable that the other shorter side 2012B of the light extraction surface 201B of the second light emitting element 20B and a shorter side 2011C of the light extraction surface 201C of the third light emitting element 20C face each other. Such a structure can decrease the thickness of the light emitting device 3000 in the Y direction. In this specification, the term "rectangle" or "rectangular" refers to a quadrangle including two longer sides, two shorter sides, and four right-angled corners. In this specification, the "right angle" includes tolerance in the range of about ±3 degrees from 90 degrees.

The emission peak wavelength of the first light emitting element 20A, the emission peak wavelength of the second light emitting element 20B, and an emission peak wavelength of the third light emitting element 20C may be substantially the same as, or different from, each other. In the case where the emission peak wavelengths of the first light emitting element 20A, the second light emitting element 20B and the third light emitting element 20C are different from each other, the light emitting device 3000 can have a high color rendering properties. In the case where the first light emitting element 20A, the second light emitting element 20B and the third light emitting element 20C are arrayed in a line, the first light emitting element 20A and the third light emitting element 20C may have substantially the same emission peak wavelength, whereas the second light emitting element 20B may have an emission peak wavelength different from an emission peak wavelength of the first light emitting element 20A. With such a structure, for example, when the output of the first light emitting element 20A is insufficient, such an insufficiency can be compensated for by the output of the third light emitting element 20C. The second light emitting element 20B having an emission peak wavelength different from emission peak wavelengths of both of the first light emitting element 20A and the third light emitting element 20C may be located between the first light emitting element 20A and the third light emitting element 20C, so that the color rendering properties of the light emitting device can be increased and the color non-uniformity thereof can be reduced. In this specification, the expression that "the emission peak wavelength is the same" indicates that a tolerance of about ±10 nm is allowed. In the case where the emission peak wavelength of the first light emitting element 20A is in the range of from 430 nm or longer and shorter than 490 nm (i.e., wavelength range of blue light), it is preferable that the emission peak wavelength of the third light emitting element 20C is in the range of 430 nm or longer and shorter than 490 nm. With such an arrangement, wavelength conversion particles having an excitation efficiency peak in the range of 430 nm or longer and shorter than 490 nm may be selected, and thus the excitation efficiency of the wavelength conversion particles can be improved.

As shown in FIG. 14A, the light extraction surface 201A of the first light emitting element 20A and the light extraction surface 201B of the second light emitting element 20B may have substantially the same height as each other in the Z direction. Alternatively, the light extraction surface 201A of the first light emitting element 20A and the light extraction surface 201B of the second light emitting element 20B may have different heights from each other in the Z direction. For example, as in a light emitting device 3000A shown in FIG. 14B, the light extraction surface 201A of the first light emitting element 20A may be positioned higher than the light extraction surface 201B of the second light emitting element 20B in the Z direction. With the structure in which the light extraction surface 201A of the first light emitting element 20A positioned higher than the light extraction surface 201B of the second light emitting element 20B in the Z direction, the light from the second light emitting element 20B can easily expand in the longer direction (i.e., X direction). As in a light emitting device 3000B shown in FIG. 14C, the light extraction surface 201A of the first light emitting element 20A may be higher than the light extraction surface 201B of the second light emitting element 20B in the Z direction. With the structure in which the light extraction surface 201A of the first light emitting element 20A is higher than the light extraction surface 201B of the second light emitting element 20B in the Z direction, the light from the first light emitting element 20A can easily expand in the longer direction (i.e., X direction).

Figure 17B:
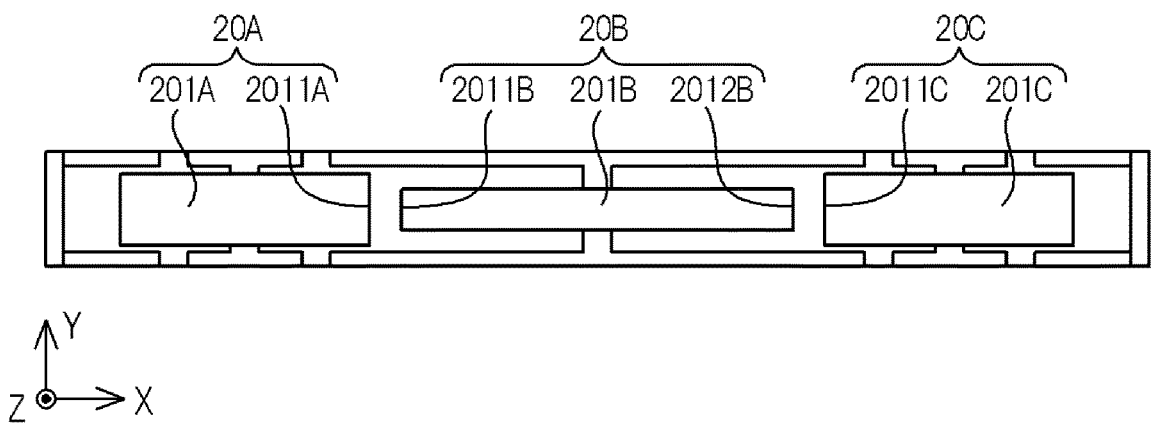
FIG. 17B is a schematic front view of a substrate, a first light emitting element, a second light emitting element and a third light emitting element according to a modification of embodiment 3.
Figure 17C:
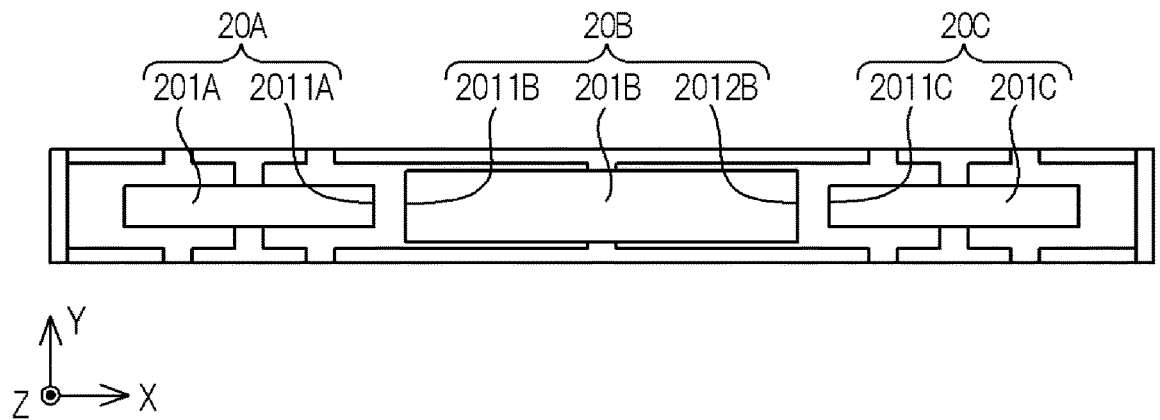
FIG. 17C is a schematic front view of a substrate, a first light emitting element, a second light emitting element and a third light emitting element according to a modification of embodiment 3.

As shown in FIG. 17A, the shorter side 2011A of the light extraction surface 201A of the first light emitting element 20A and the shorter side 2011B of the light extraction surface 201B of the second light emitting element 20B may have substantially the same length as, or have different lengths from, each other. For example, as shown in FIG. 17B, the shorter side 2011A of the light extraction surface 201A of the first light emitting element 20A may be longer than the shorter side 2011B of the light extraction surface 201B of the second light emitting element 20B. With such a structure, the light from the first light emitting element 20A can easily expand in the longer direction (i.e., X direction). As shown in FIG. 17C, the shorter side 2011A of the light extraction surface 201A of the first light emitting element 20A may be shorter than the shorter side 2011B of the light extraction surface 201B of the second light emitting element 20B. With such a structure, the light from the second light emitting element 20B can easily expand in the longer direction (i.e., X direction).

As shown in FIG. 14A, the light-transmissive member 30 may include a first light-transmissive layer 31A facing the light extraction surfaces 201A, 201B and/or 201C of the light emitting elements 20A, 20B and/or 20C, and a wavelength conversion layer 31B located on the first light-transmissive layer 31A. The first light-transmissive layer 31A includes a first matrix 312A and first diffusive particles 311A. The wavelength conversion layer 31B includes a second matrix 312B and the wavelength conversion particles 32. With the structure in which the light-transmissive member 30 includes the first light-transmissive layer 31A facing the light extraction surfaces 201A, 201B and/or 201C of the light emitting elements 20A, 20B and/or 20C, the light from the first light emitting element 20A, the second light emitting element 20B and/or the third light emitting element 20C is diffused in the first light-transmissive layer 31A. Therefore, the light from the first light emitting element 20A, the light from the second light emitting element 20B and/or the light from the third light emitting element 20C are mixed together in the first light-transmissive layer 31A, and thus the luminance non-uniformity of the light emitting device can be decreased. In the case where the first light emitting element 20A, the second light emitting element 20B and/or the third light emitting element 20C have different emission peak wavelengths from each other, the light from the first light emitting element 20A, the light from the second light emitting element 20B and/or the light from the third light emitting element 20C are mixed together in the first light-transmissive layer 31A. Therefore, the color non-uniformity of the light emitting device is reduced.

It is preferable that the first light-transmissive layer 31A contains substantially no wavelength conversion particles. The wavelength conversion particles absorb a part of the light from the light emitting elements 20A, 20B and/or 20C when being excited by the light from the light emitting elements 20A, 20B and/or 20C. With the structure in which the first light-transmissive layer 31A is located between the wavelength conversion layer 31B and the light extraction surfaces 201A, 201B and/or 201C of the light emitting elements 20A, 20B and/or 20C, the light from the first light emitting element 20A, the light from the second light emitting element 20B and/or the light from the third light emitting element 20C are mixed together in the first light-transmissive member 31A before being absorbed by the wavelength conversion particles. This can mitigate a decline in the light extraction efficiency of the light emitting device.

As shown in FIG. 14A, a second light-transmissive layer 31C may be provided on the wavelength conversion layer 31B. The second light-transmissive layer 31C contains substantially no wavelength conversion particle. The second light-transmissive layer 31C may contain a matrix 312C and second diffusive particles 311C. With the structure in which the second light-transmissive layer 31C contains the second diffusive particles 311C, the light from the light emitting elements 20A, 20B and/or 20C and the light from the wavelength conversion particles 32 excited by the light emitting elements 20A, 20B and/or 20C are mixed together in the second light-transmissive layer 31C. This can reduce the color non-uniformity of the light emitting device. For example, the second diffusive particles 311C may be formed of a material having a refractive index lower than a refractive index of the first diffusive particles 311A. With such an arrangement, the amount of light diffused by the second diffusive particles 311C is decreased, and thus the light extraction efficiency of the light emitting device 3000 can be improved. As an Example of such a refractive index relationship between the first diffusive particles 311A and the second diffusive particles 311C, the first diffusive particles 311A are formed of titanium oxide and the second diffusive particles 311C are formed of silicon oxide.

As shown in FIG. 14A, the light emitting device 3000 may include the second reflective member 41 covering the electrode formation surface 203A of the first light emitting element 20A, the electrode formation surface 203B of the second light emitting element 20B and/or an electrode formation surface 203C of the third light emitting element 20C. With the structure in which the light emitting device 3000 includes the second reflective member 41, the light from the light emitting elements 20A, 20B and/or 20C is less likely to be absorbed into the substrate 10. As shown in FIG. 2A, FIG. 10 and FIG. 12B, the first reflective member 40 may cover the electrode formation surfaces of the light emitting elements. Such a structure can also mitigate the light from the light emitting elements to be absorbed into the substrate 10. It is preferable that the second reflective member 41 includes at least one inclining portion having a greater thickness in the Z direction as being farther from the light emitting elements. With the structure in which the second reflective member 41 includes the inclining portion, the light extraction efficiency of the light emitting device 3000 can be improved.

As shown in FIG. 14A, the light emitting device 3000 may include a third reflective member 42 provided between the light guide member 50 and the first reflective member 40. The third reflective member 42 covers the lateral surfaces of the light emitting elements while the light guide member 50 is located between the lateral surfaces of the light emitting elements and the third reflective member 42. The light guide member 50 may be formed by potting or the like after the third reflective member 42 is formed, so that the shape of the light guide member 50 is less likely to be varied region by region. A surface of the third reflective member 42 that faces the light-transmissive member 30 is preferably flat. With such a structure, the light-transmissive member 30 can easily be formed after the third reflective member 42 is formed. In the case where the light emitting device 3000 includes the third reflective member 42, the first reflective member 40 covers the lateral surfaces of the first light emitting element 20A and the lateral surfaces of the second light emitting element 20B while the third reflective member 42 and the light guide member 50 are located between the lateral surfaces of the light emitting elements 20A/20B and the first reflective member 40.

Figure 18A:
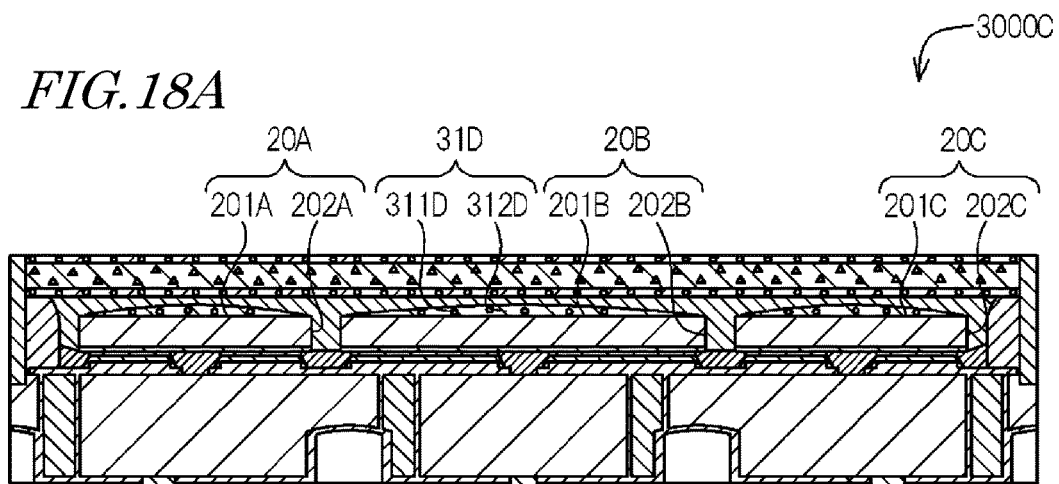
FIG. 18A is a schematic cross-sectional view of a light emitting device according to a modification of embodiment 3.

As shown in FIG. 18A, a light emitting device 3000C may include a cover member 31D covering the at least one light extraction surface of the light emitting element. The cover member 31D may include diffusive particles 311D. In this case, the cover member 31D covering the light extraction surface can reduce the amount of light traveling in the Z direction from the light emitting element, and thus can increase the amount of light traveling in the X direction and/or the Y direction. This can diffuse the light from the light emitting element in the light guide member 50, and thus can mitigate the color non-uniformity of the light emitting device. The cover member 31D is located between the light extraction surface of the light emitting element and the light guide member 50. It is preferable that at least a part of the lateral surfaces of the light emitting element is exposed from the cover member 31D that contains the third diffusive particles 311D. Such a structure can mitigate a decrease in the amount of the light traveling in the X direction and/or the Y direction from the light emitting element. The cover member 31D may cover the light extraction surfaces 201A, 201B and 201C of the light emitting elements 20A, 20B and 20C. Alternatively, the cover member 31D may cover one or more of the light extraction surfaces 201A, 201B and 201C of the light emitting elements 20A, 20B and 20C.

Figure 18B:
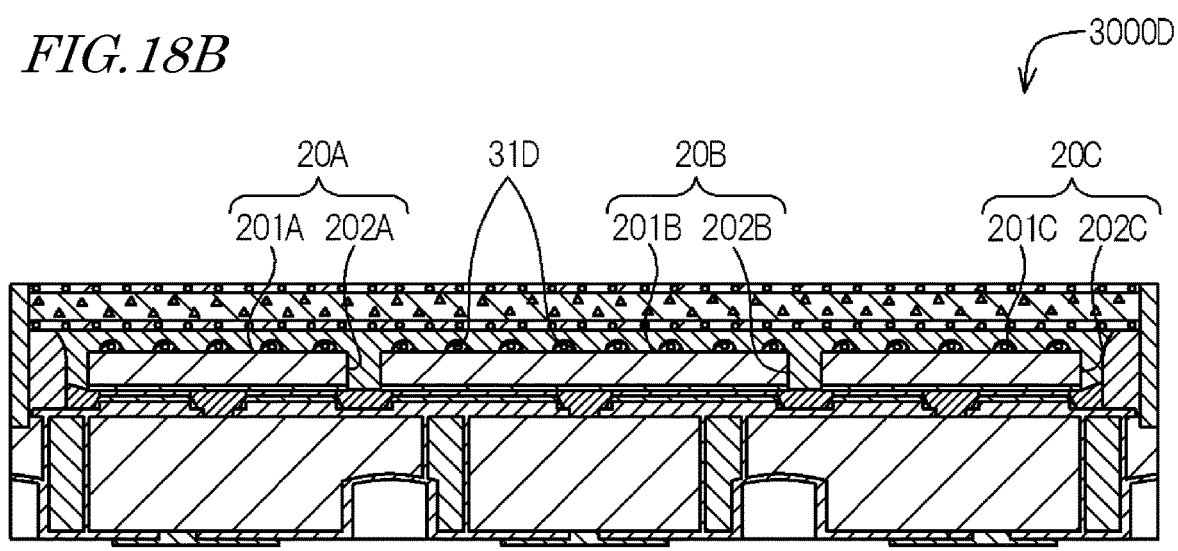
FIG. 18B is a schematic cross-sectional view of a light emitting device according to a modification of embodiment 3.

As in the light emitting device 3000C shown in FIG. 18A, the light extraction surface of one light emitting element may be covered by only one cover member 31D. Alternatively, as in a light emitting device 3000D shown in FIG. 18B, a plurality of the cover members 31D may each cover the light extraction surface of one light emitting element. As shown in FIG. 18B, a part of the light extraction surface may be exposed from the cover members 31D, so that the light extraction efficiency of the light emitting element 3000D can be improved.

The cover member 31D may contain wavelength conversion particles. The provision of at least one of the cover member 31D, which covers the light extraction surface of the light emitting element and contains the wavelength conversion particles, can facilitate color adjustment of the light emitting device. The wavelength conversion particles contained in the cover member 31D may be formed of a material same as, or different from, wavelength conversion particles of the wavelength conversion particles included in the wavelength conversion layer. In the case where, for example, the emission peak wavelength of the light emitting element is in the range of 490 nm or longer and 570 nm or shorter (i.e., wavelength range of green light), the wavelength conversion particles may be formed of a CASN-based phosphor and/or an SCASN-based phosphor, which can be excited by light in the range of 490 nm or longer and 570 nm or shorter. Alternatively, the wavelength conversion particles may be formed of a phosphor of $(Sr, Ca)LiA_3N_4$:Eu.

Embodiment 4

Figure 19:
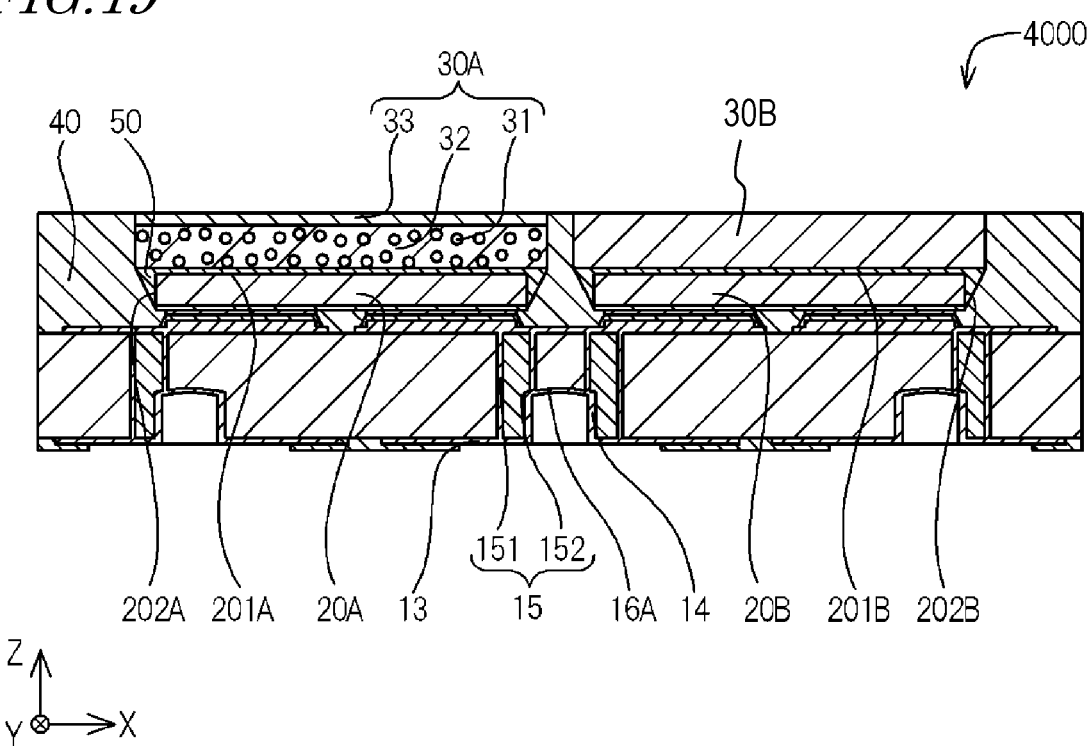
FIG. 19 is a schematic cross-sectional view of a light emitting device according to embodiment 4.

A light emitting device 4000 in embodiment 4 according to the present disclosure shown in FIG. 19 is different from the light emitting device 2000 in embodiment 2 in the structure of the light-transmissive member.

The light emitting device 4000 includes a first light-transmissive member 30A covering the first light emitting element 20A and a second light-transmissive member 30B covering the second light emitting element 20B. The first light-transmissive member 30A and the second light-transmissive member 30B are different from each other in the type of material included therein and/or the content of the material. For example, the first light-transmissive member 30A and the second light-transmissive member 30B are different from each other in the material of the wavelength conversion particles included therein and/or the content of the wavelength conversion particles. Such a structure can facilitate color adjustment of the light emitting device 4000. As shown in FIG. 19, the first light-transmissive member 30A may contain wavelength conversion particles, whereas the second light-transmissive member 30B may contain substantially no wavelength conversion particle. Such a structure can improve the light extraction efficiency of the light from the second light emitting element 20B. For example, the first light emitting element 20A may have an emission peak wavelength in the range of 430 nm or longer and shorter than 490 nm (i.e., wavelength range of blue light), the second light emitting element 20B may have an emission peak wavelength in the range of 490 nm or longer and 570 nm or shorter (i.e., wavelength range of green light), the first light-transmissive member 30A may contain wavelength conversion particles emitting green light and/or wavelength conversion particles emitting red light, and the second light-transmissive member 30B may contain substantially no wavelength conversion particle. Neither the first light-transmissive member 30A nor the second light-transmissive member 30B may contain substantially any wavelength conversion particle. The first light emitting element 20A and the second light emitting element 20B may have the same emission peak wavelength as, or different emission peak wavelengths from, each other.

Hereinafter, components of the light emitting device in embodiments according to the present disclosure will be described.

Substrate 10

The substrate 10 is a component on which one or more of the light emitting element are placed. The substrate 10 includes at least the base member 11, at least one first wiring portion 12, at least one second wiring portion 13, at least one third wiring portion 14, and at least one via 15.

Base Member 11

The base member 11 may be formed of an insulating material such as a resin, a ceramic material, glass or the like. Examples of the resin includes epoxy, bismaleimide triazine (BT), polyimide, and the like. The base member 11 may be formed of a fiberglass-reinforced plastic (e.g., glass epoxy resin). Examples of the ceramic material include aluminum oxide, aluminum nitride, zirconium oxide, zirconium nitride, titanium oxide, titanium nitride, a mixture thereof, and the like. Among these materials, it is preferable to use, especially, a material having a coefficient of linear thermal expansion close to a coefficient of linear thermal expansion of the light emitting element. The lower limit of the thickness of the base member 11 may be appropriate selected. From the point of view of the strength of the base member 11, the thickness of the base member 11 is preferably 0.05 mm or greater, and more preferably 0.2 mm or greater. From the point of view of the thickness (i.e., depth in the Z direction) of the light emitting device, the thickness of the base member 11 is preferably 0.5 mm or less, and more preferably 0.4 mm or less.

First Wiring Portion 12, Second Wiring Portion 13, Third Wiring Portion 14

The first wiring portion is located on the front surface of the substrate, and is electrically connected with the light emitting element. The second wiring portion is located on the rear surface of the substrate, and is electrically connected with the first wiring portion through the via. The third wiring portion covers the inner wall of the recessed portion (i.e., recessed portion 16), and is electrically connected with the second wiring portion. The first wiring portion, the second wiring portion and the third wiring portion may be formed of copper, iron, nickel, tungsten, chromium, aluminum, silver, gold, titanium, palladium, rhodium, or an alloy thereof. The first wiring portion, the second wiring portion and the third wiring portion may each be formed of a single layer or a plurality layers of any of the above-listed metal materials and alloys. From the point of view of, especially, heat dissipation, it is preferable to use copper or a copper alloy. The first wiring portion and/or the second wiring portion may be covered with a surface layer of, for example, silver, platinum, aluminum, rhodium, gold or an alloy thereof, from the point of view of, for example, the wettability on the conductive bonding member and/or the light reflectance.

Via 15

The via 15 is provided in a through-hole passing from the front surface through the rear surface of the base member 11, and electrically connects the first wiring portion and the second wiring portion to each other. The via 15 may include the fourth wiring 151 covering the inner surface of the through-hole in the base member and a filling member 152 filling a space enclosed by the fourth wiring 151. The fourth wiring 151 may be formed of a conductive material substantially the same as a material of the first wiring portion, the second wiring portion and the third wiring portion. The filling member 152 may be formed of a conductive material or an insulating material.

Insulating Film 18

The insulating film 18 can ensure that the rear surface of the light emitting device is insulated and reduce a risk of short-circuit of the light emitting device. The insulating film may be formed of materials that can be used in the field. The insulating film may be formed of, for example, a thermosetting resin, a thermoplastic resin or the like.

Light Emitting Element 20, 20A and 20B

The light emitting element may be a semiconductor element that itself emits light by being supplied with a voltage. For the light emitting element, a known semiconductor element formed of a nitride semiconductor or the like can be used. The light emitting element may be, for example, an LED chip. Typically, the light emitting element includes at least the semiconductor layered body 23, and in many cases, further includes the element substrate 24. It is preferable that the light emitting element has a quadrangular shape, specifically, a square shape or a rectangular shape longer in one direction, when seen in a plan view. Alternatively, the light emitting element may have other shape, for example, a hexagonal shape. In the case of the light emitting element having hexagonal shape, the light emission efficiency can be improved. Lateral surfaces of the light emitting element may be perpendicular to the top surface, or inclined inward or outward with respect to the perpendicular line to the top surface. The light emitting element includes positive and negative electrodes. The positive and negative electrodes may be formed of gold, silver, tin, platinum, rhodium, titanium, aluminum, tungsten, palladium, nickel or an alloy thereof. The emission peak wavelength of the light emitting element may be selected from a range of an ultraviolet region to an infrared region depending on the type of the semiconductor material or the mixed crystal compositions of materials. An preferable material for the semiconductor layered body may be a nitride semiconductor, which can emit light having a short wavelength capable of exciting wavelength conversion particles at a high efficiency. The nitride semiconductor is generally expressed by general formula $In_xAl_yGa_{1-x-y}N$ ($0 \leq x$, $0 \leq y$, $x+y \leq 1$). The emission peak wavelength of the light emitting element is preferably 400 nm or longer and 530 nm or shorter, more preferably 420 nm or longer and 490 nm or shorter, and still more preferably 450 nm or longer and 475 nm or shorter, from the points of view of, for example, the light emission efficiency, the excitation of the wavelength conversion particles, and color mixing relations with light emission of the wavelength conversion particles. Other examples of usable semiconductor material include an InAlGaAs-based semiconductor, an InAlGaP-based semiconductor, zinc sulfide, zinc selenide, silicon carbide and the like. The element substrate of the light emitting element is generally a substrate for crystal growth, from which a semiconductor crystal forming the semiconductor layered layer may grow. Alternatively, the element substrate may be a support substrate for supporting the semiconductor element structure that has been separated from the substrate for crystal growth. The element substrate may be light-transmissive, so that flip-chip mounting can easily be applicable and the light extraction efficiency can easily be improved. The element substrate may be a substrate formed of a material comprising sapphire, gallium nitride, aluminum nitride, silicon, silicon carbide, gallium arsenide, gallium phosphide, indium phosphide, zinc sulfide, zinc oxide, zinc selenide, diamond or the like. Among these materials, sapphire is preferable. The thickness of the element substrate may be appropriately selected, and is, for example, 0.02 mm or greater and 1 mm or less. From the point of view of the strength of the element substrate and/or the thickness of the light emitting device, it is preferred that the thickness of the element substrate is 0.05 mm or greater and 0.3 mm or less.

Light-Transmissive Member 30

The light-transmissive member is provided above the light emitting element, and protects the light emitting element. The light-transmissive member contains the matrix formed of at least a material among the materials listed below. Although it is not absolutely necessary, the light-transmissive member may include the wavelength conversion particles. In the case where the matrix in the light-transmissive member contains the wavelength conversion particles 32 described below, such light-transmissive member can also serve as a wavelength conversion layer.

The light-transmissive member may include the first light-transmissive layer, the wavelength conversion layer and the second light-transmissive layer provided as layered structure. For example, each of those layers contains the matrix as described below. The matrices of the layers may be formed of the same material as, or different materials from, each other. Example of the light-transmissive member include: a sintered body in which the wavelength conversion particles and, for example, an inorganic material such as alumina or the like; or a plate-like crystal of the wavelength conversion particles.

Matrix 31 of Light-Transmissive Member

The matrix 31 of the light-transmissive member may be formed of a material that is transmissive to light emitted by the light emitting element. The term "light-transmissive" refers to having a light transmittance, at the emission peak wavelength of the light emitting element, of preferably 60% or higher, more preferably 70% or higher, and still more preferably 80% or higher. The matrix of the light-transmissive member may be formed of a silicone resin, an epoxy resin, a phenol resin, a polycarbonate resin, an acrylic resin, or a modified resin thereof. Alternatively, the matrix of the light-transmissive member may be formed of glass. Among these materials, a silicone resin and a modified silicone resin, which are highly resistant against heat and light, are preferable. Examples of the silicone resin include dimethyl silicone resin, phenyl-methyl silicone resin, and diphenyl silicone resin. The light-transmissive member may include a single layer formed of one of the above-listed matrix materials, or may include a stack of layers formed of two or more of the above-listed matrix materials. In this specification, the term "modified resin" encompasses a hybrid resin. The "matrix of the light-transmissive member" encompasses the matrices of the first light-transmissive layer, the wavelength conversion layer and the second light-transmissive layer.

The light-transmissive member may contain various types of diffusive particles incorporated into the matrix which is formed of any of the above-listed resin materials or glass. The diffusive particles may be formed of silicon oxide, aluminum oxide, zirconium oxide, zinc oxide or the like. The diffusive particles may be formed of one material or a combination of two or more materials among these materials. Silicon oxide, which has a small coefficient of thermal expansion, is especially preferable. The diffusive particles may be nanoparticles, so that the degree of scattering of the light emitted by the light emitting element is increased and thus the amount of the wavelength conversion particles to be used can be decreased. The "nanoparticles" are particles having a particle size of 1 nm or longer and 100 nm or shorter. In this specification, the "particle size" is defined by, for example, $D_{50}$.

Wavelength Conversion Particles 32

The wavelength conversion particles absorb at least a part of primary light emitted by the light emitting element and emit secondary light having a wavelength different from that of the primary light. The wavelength conversion particles may be formed of one material or a combination of two or more materials among the examples shown below.

Examples of materials of the wavelength conversion particles emitting green light include a yttrium-aluminum-garnet-based phosphor (e.g., $Y_3(Al, Ga)_5O_{12}:Ce$), a lutetium-aluminum-garnet-based phosphor (e.g., $Lu_3(Al, Ga)_5O_{12}:Ce$), a terbium-aluminum-garnet-based phosphor (e.g., $Tb_3(Al, Ga)_5O_{12}:Ce$), a silicate-based phosphor (e.g., $(Ba, Sr)_2SiO_4:Eu$), a chlorosilicate-based phosphor (e.g., $Ca_8Mg(SiO_4)_4Cl_2$:Eu), a β-SiAlON-based phosphor (e.g., $Si_{6-z}Al_zO_zN_{8-z}$:Eu (0<z<4.2)), an SGS-based phosphor (e.g., $SrGa_2S_4$:Eu), an alkaline earth aluminate-based phosphor (e.g., (Ba, Sr, Ca)Mg$_x$Al$_{10}$O$_{16+x}$:Eu, Mn (0≤x≤1)), and the like. Examples of materials of the wavelength conversion particles emitting yellow light include an α-SiAlON-based phosphor (e.g., M$_z$(Si, Al)$_{12}$(O, N)$_{16}$ (0≤z≤2; M is Li, Mg, Ca, Y, or a lanthanide element excluding La and Ce), and the like. The above-described examples of material of the wavelength conversion particles emitting green light include a material usable for the wavelength conversion particles emitting yellow light. For example, the yttrium-aluminum-garnet-based phosphor may have a part of Y replaced with Gd, so that the emission peak wavelength is shifted toward the longer side so as to emit yellow light. The above-described examples of material of the wavelength conversion particles emitting yellow light include a material usable for wavelength conversion particles emitting orange light. Examples of materials of the wavelength conversion particles emitting red light include a nitrogen-containing calcium aluminosilicate (e.g., CASN or SCASN)-based phosphor (e.g., (Sr, Ca)AlSiN$_3$:Eu), and the like. Another example of material of the wavelength conversion particles emitting red light may be a manganese-activated fluoride-based phosphor (i.e., phosphor represented by general formula (I): $A_2[M_{1-a}Mn_aF_6]$ (in general formula (I), "A" is at least one selected from the group consisting of K, Li, Na, Rb, Cs and NH$_4$; "M" is at least one element selected from the group consisting of the group IV elements and the group XIV elements; and "a" fulfills 0<a<0.2)). A representative example of the manganese-activated fluoride-based phosphor is a phosphor of manganese-activated potassium fluorosilicate (e.g., K$_2$SiF$_6$:Mn).

Reflective Member (First Reflective Member, Second Reflective Member and/or Third Reflective Member The "reflective member" refers to the first reflective member, the second reflective member and/or the third reflective member. From the point of view of the light extraction efficiency in the Z direction, the reflective member has a light reflectance, with respect to the emission peak wavelength of the light emitting element, of preferably 70% or higher, more preferably 80% or higher, and still more preferably 90% or higher. It is also beneficial that the reflective member is white. Therefore, it is preferable that the reflective member contains a white pigment in the matrix. The reflective member is a liquid state before being cured. The reflective member may be formed by transfer molding, injection molding, compressing molding, potting or the like. In the case where the light emitting device includes the first reflective member, the second reflective member and/or the third reflective member, for example, the third reflective member may be formed by drawing whereas the first reflective member and the second reflective member may be formed by potting.

Matrix of Reflective Member

The matrix of the reflective member may be formed of a resin, for example, a silicone resin, an epoxy resin, a phenol resin, a polycarbonate resin, an acrylic resin or a modified resin thereof. Among these resins, a silicone resin and a modified silicone resin, which are highly resistant against heat and light, are preferable. Examples of the silicone resin include dimethyl silicone resin, phenyl-methyl silicone resin, and diphenyl silicone resin.

White Pigment

The white pigment may be formed of a single material or a combination of two or more materials among titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide, zirconium oxide, and silicon oxide. The white pigment may have any appropriate shape, and may be irregular or crushed shape. It is preferable that the white pigment is spherical from the point of view of the fluidity. The white pigment may have a particle size of, for example, in the range of about 0.1 μm or longer and about 0.5 μm or shorter. It is preferable that the white pigment is as small as possible in order to improve the effects of light reflection and covering. The content of the white pigment in the light-reflective member may be of any appropriate value, and is, for example, preferably in the range of 10 wt. % or higher and 80 wt. % or lower, more preferably in the range of 20 wt. % or higher and 70 wt. % or lower, and still more preferably in the range of 30 wt. % or higher and 60 wt. % or lower, from the points of view of the light reflectance, the viscosity in a liquid state, and the like. The unit "wt. %" refers to percent by weight, and represents the weight ratio of a material of interest with respect to the total weight of the reflective member, which is light-reflective.

Cover Member 31D

The cover member covers the light extraction surface of the light emitting element. The cover member has functions of diffusing the light from the light emitting element, or converting the light from the light emitting element into light having an emission peak wavelength different from that of the light from the light emitting element.

Matrix of Cover Member

The matrix of the cover member may be formed of a material the same as or similar to that of the matrix of the light-transmissive member.

Diffusive Particles of Cover Member

The diffusive particles of the cover member may be formed of a material the same as or similar to that of the diffusive particles of the light-transmissive member.

Light Guide Member 50

The light guide member bonds the light emitting element and the light-transmissive member to each other, and guides the light from the light emitting element to the light-transmissive member. The matrix of the light guide member may be formed of a silicone resin, an epoxy resin, a phenol resin, a polycarbonate resin, an acrylic resin or a modified resin thereof. Among these resins, a silicone resin and a modified silicone resin, which are highly resistant against heat and light, are preferable. Examples of the silicone resin include dimethyl silicone resin, phenyl-methyl silicone resin, and diphenyl silicone resin. The matrix of the light guide member may contain a filler (e.g., diffusive particles) and/or wavelength conversion particles the same as or similar to those in the above-described light-transmissive member. The light guide member may be absent.

Conductive Bonding Member 60

The conductive bonding member electrically connects the electrodes of the light emitting element and the first wiring portion to each other. The conductive bonding member may be formed of any one of bump formed of at least one material containing gold, silver, copper or the like; a metal paste containing metal powder of silver, gold, copper, platinum, aluminum, palladium or the like, and a resin binder; solder based on tin-bismuth, tin-copper, tin-silver, gold-tin or the like; and brazing material of a low melting-point metal material; and the like.

A light emitting device in certain embodiment according to the present disclosure can be used for, for example, backlight devices of liquid crystal display devices; various lighting devices; large-scale displays; various display devices for advertisements, destination guides and the like; projector devices; and image reading devices for digital video cameras, facsimiles, copiers, scanners and the like.

While the present invention has been described with respect to exemplary embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A light emitting device, comprising:
   a substrate including:
      a base member including a front surface extending in a first direction as a longer direction and a second direction as a shorter direction, a rear surface located opposite to the front surface, a bottom surface adjacent to and perpendicular to the front surface, and a top surface located opposite to the bottom surface, and
      a first wiring portion located on the front surface, and a second wiring portion located on the rear surface;
   a light emitting element electrically connected with the first wiring portion and placed on the first wiring portion; and
   a first reflective member covering a lateral surface of the light emitting element and the front surface of the base member;
   wherein:
   the base member has a recessed portion opened on the rear surface and the bottom surface; and
   the substrate includes a third wiring portion covering an inner wall of the recessed portion and electrically connected with the second wiring portion, and a via in contact with the first wiring portion, the second wiring portion and the third wiring portion.

2. The light emitting device of claim 1, wherein the recessed portion has a first depth defined from the rear surface to the front surface on a side close to the bottom surface and a second depth defined from the rear surface to the front surface on a side close to the top surface, the first depth being greater than the second depth.

3. The light emitting device of claim 2, wherein the recessed portion has a maximum depth at a center of the recessed portion at the bottom surface.

4. The light emitting device of claim 2, wherein the recessed portion is semicircular on the rear surface.

5. The light emitting device of claim 2, wherein the recessed portion has a maximum depth that is in a range of equal to or greater than 0.4 times and equal to or less than 0.9 times a thickness of the base member.

6. The light emitting device of claim 2, wherein the base member has at least one additional recessed portion, and the recessed portion and the at least one additional recessed portion are located in a left-right symmetrical manner on the rear surface with respect to a center line of the base member, the center line being parallel to the second direction.

7. The light emitting device of claim 1, wherein the recessed portion has a maximum depth at a center of the recessed portion at the bottom surface.

8. The light emitting device of claim 7, wherein the recessed portion is semicircular on the rear surface.

9. The light emitting device of claim 7, wherein the recessed portion has a maximum depth that is in a range of equal to or greater than 0.4 times and equal to or less than 0.9 times a thickness of the base member.

10. The light emitting device of claim 1, wherein the recessed portion is semicircular on the rear surface.

11. The light emitting device of claim 10, wherein the recessed portion has a maximum depth that is in a range of equal to or greater than 0.4 times and equal to or less than 0.9 times a thickness of the base member.

12. The light emitting device of claim 1, wherein the recessed portion has a maximum depth that is in a range of equal to or greater than 0.4 times and equal to or less than 0.9 times a thickness of the base member.

13. The light emitting device of claim 1, wherein the base member has at least one additional recessed portion, and the recessed portion and the at least one additional recessed portion are located in a left-right symmetrical manner on the rear surface with respect to a center line of the base member, the center line being parallel to the second direction.

14. The light emitting device of claim 1, further comprising a light-transmissive member covering the light emitting element.

15. The light emitting device of claim 14, wherein the first reflective member covers a lateral surface of the light-transmissive member.

16. The light emitting device of claim 1, wherein a lateral surface, extending in the shorter direction, of the first reflective member and a lateral surface, extending in the shorter direction, of the substrate are substantially flush with each other.

17. The light emitting device of claim 1, further comprising at least one additional light emitting element, and the light emitting element and the at least one additional light emitting element are arrayed in a line in the first direction.

18. The light emitting device of claim 1, wherein the via includes a fourth wiring and a filling member, and the filling member is formed of a material comprising a resin material.

19. The light emitting device of claim 1, wherein the base member includes a lateral surface located between the front surface and the rear surface, and the recessed portion is an end recessed portion opened on the rear surface, the bottom surface and the lateral surface.

20. The light emitting device of claim 19, wherein the base member has at least one additional end recessed portion, and the end recessed portion and the at least one additional end recessed portion are located on both of two ends of the base member as seen in a rear view.

* * * * *